US010782045B2

(12) United States Patent
LePoudre et al.

(10) Patent No.: US 10,782,045 B2
(45) Date of Patent: Sep. 22, 2020

(54) SYSTEMS AND METHODS FOR MANAGING CONDITIONS IN ENCLOSED SPACE

(71) Applicants: Nortek Air Solutions Canada, Inc., Saskatoon (CA); Philip Paul LePoudre, Saskatoon (CA); Manfred Gerber, Saskatoon (CA)

(72) Inventors: Philip Paul LePoudre, Saskatoon (CA); Manfred Gerber, Saskatoon (CA)

(73) Assignee: Nortek Air Solutions Canada, Inc., Saskatoon (CA)

( * ) Notice: Subject to any disclaimer, the term of this patent is extended or adjusted under 35 U.S.C. 154(b) by 0 days.

(21) Appl. No.: 15/574,205

(22) PCT Filed: May 2, 2016

(86) PCT No.: PCT/CA2016/050507
§ 371 (c)(1),
(2) Date: Nov. 15, 2017

(87) PCT Pub. No.: WO2016/183668
PCT Pub. Date: Nov. 24, 2016

(65) Prior Publication Data
US 2018/0128510 A1 May 10, 2018

Related U.S. Application Data

(63) Continuation-in-part of application No. PCT/CA2016/050252, filed on Mar. 8, 2016.
(Continued)

(51) Int. Cl.
F28F 9/00 (2006.01)
F24F 12/00 (2006.01)
(Continued)

(52) U.S. Cl.
CPC ............ *F24F 12/00* (2013.01); *F24F 3/1411* (2013.01); *F24F 5/0003* (2013.01);
(Continued)

(58) Field of Classification Search
CPC .. F28F 27/00; F28F 9/007; F28F 13/12; F28F 12/003; F28F 5/0035; F24F 12/00;
(Continued)

(56) References Cited

U.S. PATENT DOCUMENTS 1,015,831 A   1/1912  Pielock et al.
1,746,598 A   2/1930  Ljungstrom
(Continued)

FOREIGN PATENT DOCUMENTS

AU   2011286700 A1   12/2012
AU   2014231672 B2    3/2018
(Continued)

OTHER PUBLICATIONS

U.S. Appl. No. 14/830,492, filed Aug. 19, 2015, Liquid to Air Membrane Energy Exchangers.
(Continued)

*Primary Examiner* — Davis D Hwu
(74) *Attorney, Agent, or Firm* — Schwegman Lundberg & Woessner, P.A.

(57) ABSTRACT

An example system is configured to control conditions in an enclosed space. The system includes scavenger and process plenums, a liquid-to-air membrane energy exchanger (LAMEE), a first liquid-to-air heat exchanger (LAHX), a second LAHX, and a fluid circuit The scavenger plenum is configured to direct scavenger air from a scavenger inlet to a scavenger outlet. The process plenum is sealed from the scavenger plenum and is configured to direct process air from a process inlet to a process outlet The process inlet receives heated air from the space and the process outlet (Continued)

supplies cooled air to the space. The LAMEE is arranged inside the scavenger plenum. The LAMEE is configured to use the scavenger air to evaporatively cool a first fluid flowing through the LAMEE. The temperature of the first fluid at a LAMEE outlet is lower than the temperature of the first fluid at a LAMEE inlet. The first LAHX is arranged inside the process plenum. The first LAHX is configured to directly and sensibly cool the heated air from the space to a supply air temperature using a second fluid flowing through the first LAHX. The second LAHX is arranged inside the scavenger plenum downstream of the LAMEE. The second LAHX is configured to receive and cool the second fluid heated by the first LAHX using the scavenger air. The fluid circuit transports the first and second fluids among the LAMEE, the first LAHX, and the second LAHX.

23 Claims, 9 Drawing Sheets

Related U.S. Application Data

(60) Provisional application No. 62/162,487, filed on May 15, 2015.

(51) Int. Cl.
  *F24F 13/30*  (2006.01)
  *H05K 7/20*  (2006.01)
  *F24F 3/14*  (2006.01)
  *F24F 5/00*  (2006.01)
  *F24F 11/46*  (2018.01)
  *F24F 11/83*  (2018.01)
  *F28D 15/00*  (2006.01)
  *F24F 11/63*  (2018.01)
  *F24F 110/10*  (2018.01)
  *F24F 11/00*  (2018.01)

(52) U.S. Cl.
  CPC ............ *F24F 5/0035* (2013.01); *F24F 11/46* (2018.01); *F24F 11/63* (2018.01); *F24F 11/83* (2018.01); *F24F 12/002* (2013.01); *F24F 12/003* (2013.01); *F24F 13/30* (2013.01); *F28D 15/00* (2013.01); *H05K 7/2079* (2013.01); *H05K 7/20745* (2013.01); *F24F 2003/1435* (2013.01); *F24F 2011/0006* (2013.01); *F24F 2012/005* (2013.01); *F24F 2110/10* (2018.01); *F24F 2203/02* (2013.01); *F24F 2203/026* (2013.01); *F24F 2203/104* (2013.01); *Y02B 30/52* (2013.01); *Y02B 30/563* (2013.01)

(58) Field of Classification Search
  CPC .. F24F 11/63; F24F 11/00; F24F 12/03; F24F 13/30; F28D 20/0056; F25B 39/04; Y02B 30/52; Y02B 30/563
  USPC .......................................................... 165/67
  See application file for complete search history.

(56) References Cited

U.S. PATENT DOCUMENTS

| | | |
|---|---|---|
| 2,186,844 A | 1/1940 | Smith |
| 2,290,465 A | 7/1942 | Crawford et al. |
| 2,562,811 A | 7/1951 | Muffly |
| 2,946,201 A | 7/1960 | Munters |
| 2,964,298 A | 12/1960 | McIntosh et al. |
| 2,968,165 A | 1/1961 | Norback |
| 3,009,684 A | 11/1961 | Munters |
| 3,018,231 A | 1/1962 | Valentine et al. |
| 3,144,901 A | 8/1964 | Meek |
| 3,247,679 A | 4/1966 | Meckler |
| 3,291,206 A | 12/1966 | Nicholson |
| 3,401,530 A | 9/1968 | Meckler |
| 3,467,072 A | 9/1969 | Toesca |
| 3,735,559 A | 5/1973 | Salemme |
| 3,789,916 A | 2/1974 | Lindahl |
| 3,807,493 A | 4/1974 | Stewart |
| 3,965,695 A | 6/1976 | Rush et al. |
| 4,011,731 A | 3/1977 | Meckler |
| 4,113,004 A | 9/1978 | Rush et al. |
| 4,180,985 A | 1/1980 | Northrup, Jr. |
| 4,233,796 A | 11/1980 | Mazzoni et al. |
| 4,235,081 A | 11/1980 | Dowling |
| 4,257,169 A | 3/1981 | Pierce |
| 4,259,849 A | 4/1981 | Griffiths |
| 4,373,347 A | 2/1983 | Howell et al. |
| 4,426,853 A | 1/1984 | Mitani et al. |
| 4,430,864 A | 2/1984 | Mathiprakasam |
| 4,474,021 A | 10/1984 | Harband |
| 4,538,426 A | 9/1985 | Bock |
| 4,594,860 A | 6/1986 | Coellner et al. |
| 4,691,530 A | 9/1987 | Meckler |
| 4,700,550 A | 10/1987 | Rhodes |
| 4,719,761 A | 1/1988 | Cromer |
| 4,723,417 A | 2/1988 | Meckler |
| 4,729,428 A | 3/1988 | Yasutake et al. |
| 4,729,774 A | 3/1988 | Cohen et al. |
| 4,827,733 A | 5/1989 | Dinh |
| 4,841,733 A | 6/1989 | Dussault et al. |
| 4,887,438 A | 12/1989 | Meckler |
| 4,900,448 A | 2/1990 | Bonne et al. |
| 4,905,479 A | 3/1990 | Wilkinson |
| 4,909,810 A | 3/1990 | Nakao et al. |
| 4,930,322 A | 6/1990 | Ashley et al. |
| 4,936,107 A | 6/1990 | Kitagaki et al. |
| 4,939,906 A | 7/1990 | Spatz et al. |
| 4,941,324 A | 7/1990 | Peterson et al. |
| 4,982,575 A | 1/1991 | Besik |
| 5,003,961 A | 4/1991 | Besik |
| 5,020,334 A | 6/1991 | Wilkinson |
| 5,020,335 A | 6/1991 | Albers et al. |
| 5,022,241 A | 6/1991 | Wilkinson |
| 5,120,445 A | 6/1992 | Colman |
| 5,131,238 A | 7/1992 | Meckler |
| 5,148,374 A | 9/1992 | Coellner |
| 5,170,633 A | 12/1992 | Kaplan |
| 5,176,005 A | 1/1993 | Kaplan |
| 5,181,387 A | 1/1993 | Meckler |
| 5,191,771 A | 3/1993 | Meckler |
| 5,238,052 A | 8/1993 | Chagnot |
| 5,239,834 A | 8/1993 | Travers |
| 5,297,398 A | 3/1994 | Meckler |
| 5,311,929 A | 5/1994 | Verret |
| 5,325,676 A | 7/1994 | Meckler |
| 5,337,574 A | 8/1994 | Dick |
| 5,351,497 A | 10/1994 | Lowenstein |
| 5,353,606 A | 10/1994 | Yoho et al. |
| 5,373,704 A | 12/1994 | Mcfadden |
| 5,387,376 A | 2/1995 | Gasser |
| 5,448,895 A | 9/1995 | Coellner et al. |
| 5,471,852 A | 12/1995 | Meckler |
| 5,482,625 A | 1/1996 | Shimizu et al. |
| 5,496,397 A | 3/1996 | Fischer et al. |
| 5,502,975 A | 4/1996 | Brickley et al. |
| 5,517,828 A | 5/1996 | Calton et al. |
| 5,526,651 A | 6/1996 | Worek et al. |
| 5,542,968 A | 8/1996 | Belding et al. |
| 5,551,245 A | 9/1996 | Calton et al. |
| 5,564,281 A | 10/1996 | Calton et al. |
| 5,579,647 A * | 12/1996 | Calton .................. F24F 3/1411 62/223 |
| 5,580,369 A | 12/1996 | Belding et al. |
| 5,632,954 A | 5/1997 | Coellner et al. |
| 5,638,900 A | 6/1997 | Lowenstein et al. |
| 5,649,428 A | 7/1997 | Calton et al. |
| 5,650,221 A | 7/1997 | Belding et al. |
| 5,653,115 A | 8/1997 | Brickley et al. |
| 5,660,048 A | 8/1997 | Belding et al. |

(56) References Cited

U.S. PATENT DOCUMENTS

| | | | |
|---|---|---|---|
| 5,661,983 | A | 9/1997 | Groten et al. |
| 5,685,897 | A | 11/1997 | Belding et al. |
| 5,701,762 | A | 12/1997 | Akamatsu et al. |
| 5,718,286 | A | 2/1998 | Damsohn et al. |
| 5,727,394 | A | 3/1998 | Belding et al. |
| 5,732,562 | A | 3/1998 | Moratalla |
| 5,749,230 | A | 5/1998 | Coellner et al. |
| 5,758,508 | A | 6/1998 | Belding et al. |
| 5,758,511 | A | 6/1998 | Yoho et al. |
| 5,761,915 | A | 6/1998 | Rao |
| 5,761,923 | A | 6/1998 | Maeda |
| 5,771,707 | A | 6/1998 | Lagace et al. |
| 5,777,846 | A | 7/1998 | Hayes et al. |
| 5,791,153 | A | 8/1998 | Belding et al. |
| 5,791,157 | A | 8/1998 | Maeda |
| 5,816,065 | A | 10/1998 | Maeda |
| 5,825,641 | A | 10/1998 | Mangtani |
| 5,826,434 | A | 10/1998 | Belding et al. |
| 5,826,641 | A | 10/1998 | Bierwirth et al. |
| 5,832,736 | A | 11/1998 | Yoshioka et al. |
| 5,832,988 | A | 11/1998 | Mistry et al. |
| 5,860,284 | A | 1/1999 | Goland et al. |
| 5,890,372 | A | 4/1999 | Belding et al. |
| 5,911,273 | A | 6/1999 | Brenner et al. |
| 5,931,016 | A | 8/1999 | Yoho |
| 5,943,874 | A | 8/1999 | Maeda |
| 5,946,931 | A | 9/1999 | Lomax et al. |
| 5,950,447 | A | 9/1999 | Maeda et al. |
| 5,957,194 | A | 9/1999 | Azar |
| 5,992,160 | A | 11/1999 | Bussjager et al. |
| 6,003,327 | A | 12/1999 | Belding et al. |
| 6,004,384 | A | 12/1999 | Caudle |
| 6,018,953 | A | 2/2000 | Belding et al. |
| 6,018,954 | A | 2/2000 | Assaf |
| 6,029,462 | A | 2/2000 | Denniston |
| 6,029,467 | A | 2/2000 | Moratalla |
| 6,034,873 | A | 3/2000 | Stahl et al. |
| 6,050,100 | A | 4/2000 | Belding et al. |
| 6,055,157 | A | 4/2000 | Bartilson |
| 6,079,481 | A | 6/2000 | Lowenstein et al. |
| 6,094,835 | A | 8/2000 | Cromer |
| 6,104,003 | A | 8/2000 | Jones |
| 6,119,768 | A | 9/2000 | Dreier et al. |
| 6,138,470 | A | 10/2000 | Potnis et al. |
| 6,141,979 | A | 11/2000 | Dunlap |
| 6,145,588 | A | 11/2000 | Martin et al. |
| 6,156,102 | A | 12/2000 | Conrad et al. |
| 6,164,369 | A | 12/2000 | Stoller et al. |
| 6,176,101 | B1 | 1/2001 | Lowenstein |
| 6,178,762 | B1 | 1/2001 | Flax |
| 6,199,388 | B1 | 3/2001 | Fischer |
| 6,199,392 | B1 | 3/2001 | Maeda |
| 6,201,705 | B1 | 3/2001 | Nygren et al. |
| 6,237,354 | B1 | 5/2001 | Cromer |
| 6,269,650 | B1 | 8/2001 | Shaw |
| 6,292,365 | B1 | 9/2001 | Ashiwake et al. |
| 6,305,180 | B1 | 10/2001 | Miller |
| 6,311,511 | B1 | 11/2001 | Maeda |
| 6,318,106 | B1 | 11/2001 | Maeda |
| RE37,464 | E | 12/2001 | Meckler |
| 6,361,585 | B1 | 3/2002 | Anzai et al. |
| 6,363,218 | B1 | 3/2002 | Lowenstein et al. |
| 6,409,157 | B1 | 6/2002 | Lundin |
| 6,412,295 | B2 | 7/2002 | Weiss et al. |
| 6,430,044 | B2 | 8/2002 | Hutchinson et al. |
| 6,442,951 | B1 | 9/2002 | Maeda et al. |
| 6,494,050 | B2 | 12/2002 | Spinazzola et al. |
| 6,494,053 | B1 | 12/2002 | Forkosh |
| 6,497,107 | B2 | 12/2002 | Maisotsenko et al. |
| 6,507,494 | B1 | 1/2003 | Hutchison et al. |
| 6,532,763 | B1 | 3/2003 | Gupte |
| 6,546,746 | B2 | 4/2003 | Forkosh et al. |
| 6,557,365 | B2 | 5/2003 | Dinnage |
| 6,557,624 | B1 | 5/2003 | Stahl et al. |
| 6,568,466 | B2 | 5/2003 | Lowenstein et al. |
| 6,574,104 | B2 | 6/2003 | Patel et al. |
| 6,575,228 | B1 | 6/2003 | Ragland et al. |
| 6,591,898 | B1 | 7/2003 | Chu et al. |
| 6,598,862 | B2 | 7/2003 | Merrill et al. |
| 6,611,428 | B1 | 8/2003 | Wong |
| 6,612,365 | B1 | 9/2003 | Saishu et al. |
| 6,622,508 | B2 | 9/2003 | Dinnage |
| 6,625,017 | B1 | 9/2003 | Lin |
| 6,628,520 | B2 | 9/2003 | Patel et al. |
| 6,635,104 | B2 | 10/2003 | Komkova et al. |
| 6,644,059 | B2 | 11/2003 | Maeda et al. |
| 6,684,649 | B1 | 2/2004 | Thompson |
| 6,684,653 | B2 | 2/2004 | Des Champs et al. |
| 6,694,759 | B1 | 2/2004 | Bash et al. |
| 6,705,389 | B1 | 3/2004 | Stahl et al. |
| 6,709,492 | B1 | 3/2004 | Spadaccini et al. |
| 6,711,907 | B2 | 3/2004 | Dinnage et al. |
| 6,714,412 | B1 | 3/2004 | Chu et al. |
| 6,719,038 | B2 | 4/2004 | Bird et al. |
| 6,720,990 | B1 | 4/2004 | Walker et al. |
| 6,739,142 | B2 | 5/2004 | Korin |
| 6,742,583 | B2 | 6/2004 | Tikka et al. |
| 6,744,632 | B2 | 6/2004 | Wilson |
| 6,745,579 | B2 | 6/2004 | Spinazzola et al. |
| 6,745,826 | B2 | 6/2004 | Lowenstein et al. |
| 6,747,872 | B1 | 6/2004 | Patel et al. |
| 6,751,964 | B2 | 6/2004 | Fischer |
| 6,786,056 | B2 | 9/2004 | Bash et al. |
| 6,800,118 | B2 | 10/2004 | Kusunose et al. |
| 6,819,563 | B1 | 11/2004 | Chu et al. |
| 6,841,601 | B2 | 1/2005 | Serpico et al. |
| 6,848,265 | B2 | 2/2005 | Lowenstein et al. |
| 6,854,278 | B2 | 2/2005 | Maisotsenko et al. |
| 6,864,005 | B2 | 3/2005 | Mossman |
| 6,867,967 | B2 | 3/2005 | Mok |
| 6,868,683 | B2 | 3/2005 | Bash et al. |
| 6,877,551 | B2 | 4/2005 | Stoller |
| 6,880,349 | B2 | 4/2005 | Johnson et al. |
| 6,917,522 | B1 | 7/2005 | Erturk et al. |
| 6,927,980 | B2 | 8/2005 | Fukuda et al. |
| 6,935,416 | B1 | 8/2005 | Tsunoda et al. |
| 6,936,767 | B2 | 8/2005 | Kleinecke et al. |
| 6,973,795 | B1 | 12/2005 | Moffitt |
| 6,973,801 | B1 | 12/2005 | Campbell et al. |
| 6,976,365 | B2 | 12/2005 | Forkosh et al. |
| 6,978,633 | B2 | 12/2005 | Yamazaki |
| 7,000,427 | B2 | 2/2006 | Mathias et al. |
| 7,007,506 | B2 | 3/2006 | Kubo et al. |
| 7,017,356 | B2 | 3/2006 | Moffitt |
| 7,017,655 | B2 | 3/2006 | Wilson |
| 7,042,722 | B2 | 5/2006 | Suzuki et al. |
| 7,047,751 | B2 | 5/2006 | Dinnage et al. |
| 7,086,603 | B2 | 8/2006 | Bash et al. |
| 7,092,006 | B2 | 8/2006 | Walker et al. |
| 7,093,452 | B2 | 8/2006 | Chee et al. |
| 7,093,649 | B2 | 8/2006 | Dawson |
| RE39,288 | E | 9/2006 | Assaf |
| 7,128,138 | B2 | 10/2006 | Des Champs |
| 7,139,169 | B2 | 11/2006 | Alperin et al. |
| 7,178,355 | B2 | 2/2007 | Moffitt |
| 7,180,737 | B2 | 2/2007 | Straub, Jr. et al. |
| 7,181,918 | B2 | 2/2007 | Reinders et al. |
| 7,187,547 | B1 | 3/2007 | French et al. |
| 7,222,660 | B2 | 5/2007 | Giacoma et al. |
| 7,231,967 | B2 | 6/2007 | Haglid |
| 7,262,964 | B1 | 8/2007 | Barsun |
| 7,269,966 | B2 | 9/2007 | Lowenstein et al. |
| 7,274,568 | B1 | 9/2007 | Chayut |
| 7,278,273 | B1 | 10/2007 | Whitted et al. |
| 7,306,650 | B2 | 12/2007 | Slayzak et al. |
| 7,312,993 | B2 | 12/2007 | Bundza et al. |
| 7,313,924 | B2 | 1/2008 | Bash et al. |
| 7,315,448 | B1 | 1/2008 | Bash et al. |
| 7,319,596 | B2 | 1/2008 | Fujiya et al. |
| 7,331,376 | B2 | 2/2008 | Gagnon et al. |
| 7,340,906 | B2 | 3/2008 | Moffitt |
| 7,347,058 | B2 | 3/2008 | Malone |
| 7,362,571 | B2 | 4/2008 | Kelley et al. |
| 7,379,299 | B2 | 5/2008 | Walsh et al. |

(56) References Cited

U.S. PATENT DOCUMENTS

| | | |
|---|---|---|
| 7,385,810 B2 | 6/2008 | Chu et al. |
| 7,389,646 B2 | 6/2008 | Moffitt |
| 7,389,652 B1 | 6/2008 | Fair |
| 7,392,836 B2 | 7/2008 | Wong |
| 7,403,392 B2 | 7/2008 | Attlesey et al. |
| 7,418,995 B2 | 9/2008 | Howard et al. |
| 7,438,638 B2 | 10/2008 | Lewis, II |
| 7,457,112 B2 | 11/2008 | Fukuda et al. |
| 7,518,867 B2 | 4/2009 | Yazawa et al. |
| 7,573,713 B2 | 8/2009 | Hoffman et al. |
| 7,586,741 B2 | 9/2009 | Matsushima et al. |
| 7,586,745 B1 | 9/2009 | Szelong et al. |
| 7,591,868 B2 | 9/2009 | Johnson |
| 7,593,033 B2 | 9/2009 | Walker et al. |
| 7,595,985 B2 | 9/2009 | Adducci et al. |
| 7,596,476 B2 | 9/2009 | Rasmussen et al. |
| 7,602,414 B2 | 10/2009 | Walker et al. |
| 7,604,534 B2 | 10/2009 | Hill |
| 7,604,535 B2 | 10/2009 | Germagian et al. |
| 7,605,840 B2 | 10/2009 | Walker et al. |
| 7,643,285 B2 | 1/2010 | Nishiyama et al. |
| 7,647,787 B2 | 1/2010 | Belady et al. |
| 7,675,748 B2 | 3/2010 | Matsushima et al. |
| 7,679,909 B2 | 3/2010 | Spearing et al. |
| 7,682,234 B1 | 3/2010 | Beitelmal et al. |
| 7,716,829 B2 | 5/2010 | Des Champs |
| 7,717,404 B2 | 5/2010 | Hasegawa et al. |
| 7,717,406 B2 | 5/2010 | Graef |
| 7,719,565 B2 | 5/2010 | Walker et al. |
| 7,729,115 B2 | 6/2010 | Hall et al. |
| 7,733,648 B2 | 6/2010 | Fujiya et al. |
| 7,737,224 B2 | 6/2010 | Willis et al. |
| 7,753,766 B2 | 7/2010 | Master et al. |
| 7,753,991 B2 | 7/2010 | Kertzman |
| 7,781,034 B2 | 8/2010 | Yializis et al. |
| 7,798,892 B2 | 9/2010 | Aiello et al. |
| 7,817,182 B2 | 10/2010 | Walker et al. |
| 7,830,658 B2 | 11/2010 | Van Andel |
| 7,841,199 B2 | 11/2010 | VanGilder et al. |
| 7,864,527 B1 | 1/2011 | Whitted |
| 7,870,893 B2 | 1/2011 | Ouyang et al. |
| 7,885,795 B2 | 2/2011 | Rasmussen et al. |
| 7,895,854 B2 | 3/2011 | Bash |
| D638,925 S | 5/2011 | Charlebois et al. |
| 7,942,387 B2 | 5/2011 | Forkosh |
| 7,966,841 B2 | 6/2011 | Lowenstein et al. |
| 7,995,339 B2 | 8/2011 | Bash et al. |
| 8,002,023 B2 | 8/2011 | Murayama |
| 8,033,532 B2 | 10/2011 | Yabu |
| 8,137,436 B2 | 3/2012 | Calis et al. |
| 8,157,891 B2 | 4/2012 | Montie et al. |
| 8,201,616 B2 | 6/2012 | Kim et al. |
| 8,267,164 B2 | 9/2012 | Lestage et al. |
| 8,267,758 B2 | 9/2012 | Liu et al. |
| 8,318,824 B2 | 11/2012 | Matsuoka et al. |
| 8,327,656 B2 | 12/2012 | Tutunoglu et al. |
| 8,464,781 B2 | 6/2013 | Kenny et al. |
| 8,469,782 B1 | 6/2013 | Roy |
| 8,550,151 B2 | 10/2013 | Murayama et al. |
| 8,631,661 B2 | 1/2014 | Teige et al. |
| 8,747,531 B2 | 6/2014 | Dinnage |
| 8,769,971 B2 | 7/2014 | Kozubal et al. |
| 8,783,053 B2 | 7/2014 | McCann |
| 8,887,523 B2 | 11/2014 | Gommed et al. |
| 8,899,061 B2 | 12/2014 | Reytblat |
| 8,915,092 B2 | 12/2014 | Gerber et al. |
| 8,920,699 B2 | 12/2014 | Marutani et al. |
| 8,943,848 B2 | 2/2015 | Phannavong et al. |
| 8,966,924 B2 | 3/2015 | Pichai |
| 8,978,741 B2 | 3/2015 | Sharma et al. |
| 9,021,821 B2 | 5/2015 | Dunnavant |
| 9,027,764 B2 | 5/2015 | Murutani et al. |
| 9,109,808 B2 | 8/2015 | Gerber et al. |
| 9,188,349 B2 | 11/2015 | Warmerdam et al. |
| 9,234,665 B2 | 1/2016 | Erb et al. |
| 9,243,810 B2 | 1/2016 | Vandermeulen et al. |
| 9,273,877 B2 | 3/2016 | Vandermeulen |
| 9,429,332 B2 | 8/2016 | Vandermeulen et al. |
| 9,810,439 B2 | 11/2017 | Coutu et al. |
| 9,816,760 B2 | 11/2017 | LePoudre et al. |
| 9,909,768 B2 | 3/2018 | Gerber et al. |
| 10,197,310 B2 | 2/2019 | Ghadiri Moghaddam et al. |
| 2001/0003902 A1 | 6/2001 | Kopko |
| 2002/0005271 A1 | 1/2002 | Weiss et al. |
| 2002/0038552 A1 | 4/2002 | Maisotsenko |
| 2003/0014983 A1 | 1/2003 | Maisotsenko et al. |
| 2003/0037905 A1* | 2/2003 | Weng .................. F24F 5/0035 165/60 |
| 2003/0050003 A1 | 3/2003 | Charron |
| 2003/0070787 A1 | 4/2003 | Moffitt |
| 2003/0121271 A1 | 7/2003 | Dinnage et al. |
| 2004/0000152 A1 | 1/2004 | Fischer |
| 2004/0060315 A1 | 4/2004 | Dinnage et al. |
| 2004/0061245 A1 | 4/2004 | Maisotsenko et al. |
| 2004/0134211 A1 | 7/2004 | Lee et al. |
| 2004/0134212 A1 | 7/2004 | Lee et al. |
| 2004/0168462 A1 | 9/2004 | Assaf |
| 2004/0226685 A1 | 11/2004 | Gagnon et al. |
| 2005/0056042 A1 | 3/2005 | Bourne et al. |
| 2005/0072303 A1 | 4/2005 | Weidenmann |
| 2005/0230080 A1 | 10/2005 | Paul et al. |
| 2005/0249901 A1 | 11/2005 | Yializis et al. |
| 2005/0262862 A1 | 12/2005 | Moffitt |
| 2006/0021615 A1 | 2/2006 | Kertzman |
| 2006/0032258 A1 | 2/2006 | Pruitt et al. |
| 2006/0042295 A1 | 3/2006 | Assaf |
| 2006/0205301 A1 | 9/2006 | Klare et al. |
| 2007/0029685 A1 | 2/2007 | Lin |
| 2007/0056894 A1 | 3/2007 | Connors, Jr. |
| 2007/0079623 A1 | 4/2007 | Inaba et al. |
| 2007/0095519 A1 | 5/2007 | Hombucher |
| 2007/0125110 A1 | 6/2007 | Abel |
| 2007/0234743 A1 | 10/2007 | Assaf |
| 2007/0279861 A1 | 12/2007 | Doll et al. |
| 2008/0023182 A1 | 1/2008 | Beamer et al. |
| 2008/0066888 A1 | 3/2008 | Tong et al. |
| 2008/0085437 A1 | 4/2008 | Dean et al. |
| 2008/0099184 A1 | 5/2008 | Han |
| 2008/0283217 A1 | 11/2008 | Gagnon et al. |
| 2009/0095162 A1 | 4/2009 | Hargis et al. |
| 2009/0126913 A1 | 5/2009 | Lee et al. |
| 2009/0133866 A1 | 5/2009 | Campbell et al. |
| 2009/0193974 A1 | 8/2009 | Montie et al. |
| 2009/0294110 A1 | 12/2009 | Foust |
| 2009/0324929 A1 | 12/2009 | Yamakawa et al. |
| 2010/0058778 A1 | 3/2010 | Bhatti et al. |
| 2010/0090356 A1 | 4/2010 | Sines et al. |
| 2010/0170655 A1 | 7/2010 | Kronvall et al. |
| 2010/0170776 A1 | 7/2010 | Ehrenberg et al. |
| 2010/0192605 A1 | 8/2010 | Fang et al. |
| 2010/0200068 A1 | 8/2010 | D'arcy et al. |
| 2010/0275629 A1 | 11/2010 | Erickson |
| 2010/0300123 A1 | 12/2010 | Park et al. |
| 2010/0319370 A1 | 12/2010 | Kozubal et al. |
| 2011/0048687 A1 | 3/2011 | Des Champs |
| 2011/0056384 A1 | 3/2011 | Kadota |
| 2011/0174003 A1 | 7/2011 | Wenger |
| 2011/0192579 A1 | 8/2011 | Sotokawa et al. |
| 2011/0223486 A1 | 9/2011 | Zhang et al. |
| 2011/0232485 A1 | 9/2011 | Ellsworth |
| 2011/0232633 A1 | 9/2011 | Lima |
| 2011/0256822 A1 | 10/2011 | Carlson |
| 2011/0259572 A1 | 10/2011 | Muratani et al. |
| 2011/0308265 A1 | 12/2011 | Phannavong et al. |
| 2011/0315350 A1 | 12/2011 | Curtis |
| 2012/0000227 A1 | 1/2012 | Matsuura et al. |
| 2012/0031133 A1 | 2/2012 | Kuwabara et al. |
| 2012/0061045 A1 | 3/2012 | Huizing |
| 2012/0073791 A1 | 3/2012 | Dubois |
| 2012/0085112 A1 | 4/2012 | Wintemute |
| 2012/0106073 A1 | 5/2012 | Wu et al. |
| 2012/0125020 A1 | 5/2012 | Vandermeulen et al. |
| 2012/0125021 A1 | 5/2012 | Vandermeulen et al. |
| 2012/0125023 A1 | 5/2012 | Kopko et al. |

(56) References Cited

U.S. PATENT DOCUMENTS

| | | |
|---|---|---|
| 2012/0125031 A1 | 5/2012 | Vandermeulen et al. |
| 2012/0125405 A1 | 5/2012 | Vandermeulen et al. |
| 2012/0125581 A1 | 5/2012 | Allen et al. |
| 2012/0131796 A1 | 5/2012 | Des Champs |
| 2012/0131934 A1 | 5/2012 | Vandermeulen et al. |
| 2012/0131937 A1 | 5/2012 | Vandermeulen et al. |
| 2012/0131938 A1 | 5/2012 | Vandermeulen et al. |
| 2012/0131939 A1 | 5/2012 | Vandermeulen et al. |
| 2012/0131940 A1 | 5/2012 | Vandermeulen et al. |
| 2012/0132513 A1 | 5/2012 | Vandermeulen et al. |
| 2012/0162918 A1 | 6/2012 | Thyni et al. |
| 2012/0167600 A1 | 7/2012 | Dunnavant |
| 2012/0167610 A1 | 7/2012 | Dunnavant |
| 2012/0168119 A1 | 7/2012 | Dunnavant |
| 2012/0168369 A1 | 7/2012 | Van Medevoort et al. |
| 2012/0171943 A1 | 7/2012 | Dunnavant |
| 2012/0180505 A1 | 7/2012 | Gerber et al. |
| 2012/0186281 A1 | 7/2012 | Vandermeulen et al. |
| 2012/0204717 A1 | 8/2012 | Dinnage |
| 2012/0247132 A1 | 10/2012 | Lakdawala et al. |
| 2012/0298334 A1 | 11/2012 | Madaffari et al. |
| 2012/0298340 A1 | 11/2012 | Al-Otaibi |
| 2013/0010423 A1 | 1/2013 | Carlson |
| 2013/0023196 A1 | 1/2013 | Fisher et al. |
| 2013/0029148 A1 | 3/2013 | Hemingson |
| 2013/0056177 A1 | 3/2013 | Coutu et al. |
| 2013/0094136 A1 | 4/2013 | Gross et al. |
| 2013/0186121 A1 | 7/2013 | Erb et al. |
| 2013/0199220 A1 | 8/2013 | Ma et al. |
| 2013/0240438 A1 | 9/2013 | Willis et al. |
| 2013/0248147 A1 | 9/2013 | Wintemute et al. |
| 2013/0283837 A1 | 10/2013 | Takahashi et al. |
| 2013/0298580 A1 | 11/2013 | Dinnage |
| 2013/0340449 A1 | 12/2013 | Kozubal et al. |
| 2014/0054004 A1* | 2/2014 | LePoudre ............... F28F 13/12 165/67 |
| 2014/0054013 A1 | 2/2014 | Lepoudre et al. |
| 2014/0083648 A1 | 3/2014 | Wawryk |
| 2014/0190037 A1 | 7/2014 | Erb et al. |
| 2014/0190198 A1 | 7/2014 | Slessman et al. |
| 2014/0235157 A1 | 8/2014 | Wawryk |
| 2014/0138851 A1 | 9/2014 | LePoudre |
| 2014/0245769 A1 | 9/2014 | Vandermeulen et al. |
| 2014/0260367 A1 | 9/2014 | Coutu et al. |
| 2014/0260369 A1 | 9/2014 | Lepoudre et al. |
| 2014/0260373 A1 | 9/2014 | Gerber et al. |
| 2014/0260399 A1 | 9/2014 | Vandermeulen |
| 2014/0262125 A1 | 9/2014 | Erb et al. |
| 2014/0262144 A1 | 9/2014 | Erb et al. |
| 2014/0326433 A1 | 11/2014 | Kozubal |
| 2014/0340842 A1 | 11/2014 | Towner et al. |
| 2015/0096714 A1* | 4/2015 | Dagley ................. F24F 12/003 165/8 |
| 2015/0184876 A1 | 7/2015 | Vandermeulen et al. |
| 2015/0292754 A1 | 10/2015 | Mongar |
| 2015/0323203 A1 | 11/2015 | Gerber et al. |
| 2015/0369527 A1 | 12/2015 | Ghadiri Moghaddam et al. |
| 2016/0054012 A1 | 2/2016 | Lepoudre et al. |
| 2016/0187010 A1 | 6/2016 | Vandermeulen |
| 2016/0209087 A1 | 7/2016 | Reytblat et al. |
| 2016/0290666 A1 | 10/2016 | Coutu et al. |
| 2016/0298865 A1 | 10/2016 | Gerber et al. |
| 2016/0327345 A1 | 11/2016 | Lowenstein |
| 2017/0241655 A1 | 8/2017 | Lepoudre et al. |
| 2018/0073753 A1 | 3/2018 | Lepoudre et al. |
| 2018/0128510 A1 | 5/2018 | Lepoudre et al. |
| 2018/0135880 A1 | 5/2018 | Ghadiri Moghaddam et al. |
| 2018/0187918 A1 | 7/2018 | Lepoudre et al. |
| 2019/0113247 A1 | 4/2019 | Lepoudre et al. |

FOREIGN PATENT DOCUMENTS

| | | |
|---|---|---|
| AU | 2015230799 B2 | 3/2018 |
| AU | 2013305427 B2 | 4/2018 |
| AU | 2014231681 B2 | 6/2018 |
| AU | 2013305428 B2 | 9/2018 |
| CA | 2283089 A1 | 11/2000 |
| CA | 2801352 A1 | 12/2011 |
| CA | 2798928 A1 | 2/2012 |
| CA | 2843763 A1 | 3/2013 |
| CA | 2904224 A1 | 9/2014 |
| CH | 193732 A | 10/1937 |
| CN | 1163389 A | 10/1997 |
| CN | 1265731 A | 9/2000 |
| CN | 1343292 A | 4/2002 |
| CN | 1456855 A | 11/2003 |
| CN | 1517610 A | 8/2004 |
| CN | 1518477 A | 8/2004 |
| CN | 1666081 A | 9/2005 |
| CN | 1711448 A | 12/2005 |
| CN | 1717566 A | 1/2006 |
| CN | 200958820 Y | 10/2007 |
| CN | 101346588 A | 1/2009 |
| CN | 101405559 A | 4/2009 |
| CN | 101421580 A | 4/2009 |
| CN | 101469090 A | 7/2009 |
| CN | 101918777 A | 12/2010 |
| CN | 102076401 A | 5/2011 |
| CN | 201906567 U | 7/2011 |
| CN | 102165268 A | 8/2011 |
| CN | 102232015 A | 11/2011 |
| CN | 102345909 A | 2/2012 |
| CN | 102395419 A | 3/2012 |
| CN | 102548727 A | 7/2012 |
| CN | 102549361 A | 7/2012 |
| CN | 102933931 A | 2/2013 |
| CN | 103069246 A | 4/2013 |
| CN | 103827595 A | 5/2014 |
| CN | 104048434 A | 9/2014 |
| CN | 203893703 U | 10/2014 |
| CN | 104136855 A | 11/2014 |
| CN | 104583706 A | 4/2015 |
| CN | 105121989 A | 12/2015 |
| CN | 105164474 A | 12/2015 |
| CN | 105164484 A | 12/2015 |
| CN | 105202795 A | 12/2015 |
| CN | 105283715 A | 1/2016 |
| CN | 101512238 A | 8/2016 |
| CN | 107208910 A | 9/2017 |
| CN | 107249715 A | 10/2017 |
| CN | 107300230 A | 10/2017 |
| CN | 107560482 A | 1/2018 |
| CN | 107850335 A | 3/2018 |
| CN | 107923647 A | 4/2018 |
| CN | 108027221 A | 5/2018 |
| CN | 109073265 A | 12/2018 |
| DE | 10143092 A1 | 3/2003 |
| EP | 0448991 A2 | 10/1991 |
| EP | 0661502 A2 | 7/1995 |
| EP | 0678321 A2 | 10/1995 |
| EP | 1108575 A1 | 6/2001 |
| EP | 2079000 A2 | 7/2009 |
| EP | 2397787 A2 | 12/2011 |
| EP | 1266548 B2 | 7/2015 |
| EP | 2751493 B1 | 3/2018 |
| FR | 2291457 A1 | 6/1976 |
| GB | 1354502 A | 6/1974 |
| GB | 2015384 A | 9/1979 |
| IN | 201717044889 A | 3/2018 |
| IN | 201717044890 A | 3/2018 |
| IN | 201817002765 A | 4/2018 |
| IN | 201817037404 | 12/2018 |
| JP | 6152594 A | 3/1986 |
| JP | 05157282 A | 6/1993 |
| JP | 09196482 A | 7/1997 |
| JP | 10170177 A | 6/1998 |
| JP | 2004116419 A | 4/2004 |
| JP | 2004257588 A | 9/2004 |
| JP | 2008070046 A | 3/2008 |
| JP | 2009275955 A | 11/2009 |
| SG | 10201809840 | 12/2018 |
| TW | I271499 B | 1/2007 |
| WO | Wo-2014142277 A1 | 9/1820 |

(56) References Cited

FOREIGN PATENT DOCUMENTS

| | | |
|---|---|---|
| WO | WO-1996041107 A1 | 12/1996 |
| WO | WO-1999014535 A1 | 3/1999 |
| WO | WO-0135039 A1 | 5/2001 |
| WO | WO-0171260 A1 | 9/2001 |
| WO | WO-03049835 A1 | 6/2003 |
| WO | WO-2004065875 A1 | 8/2004 |
| WO | WO-2008037079 A1 | 4/2008 |
| WO | WO-2008041788 A1 | 4/2008 |
| WO | WO-2008053367 A2 | 5/2008 |
| WO | WO-2008089484 A1 | 7/2008 |
| WO | WO-2009000974 A1 | 12/2008 |
| WO | WO-2009094032 A1 | 7/2009 |
| WO | WO-2009158030 A1 | 12/2009 |
| WO | WO-2010006968 A1 | 1/2010 |
| WO | WO-2011062808 A1 | 5/2011 |
| WO | WO-2011161547 A2 | 12/2011 |
| WO | WO-2011161547 A3 | 12/2011 |
| WO | WO-2012018089 A1 | 2/2012 |
| WO | WO-2012042553 A1 | 4/2012 |
| WO | WO-2012087273 A1 | 6/2012 |
| WO | WO-2012097445 A1 | 7/2012 |
| WO | WO-2012167366 A1 | 12/2012 |
| WO | WO-2013029148 A1 | 3/2013 |
| WO | WO-2013094206 A1 | 6/2013 |
| WO | WO-2013107554 A1 | 7/2013 |
| WO | WO-2013192397 A1 | 12/2013 |
| WO | WO-2014029003 A1 | 2/2014 |
| WO | WO-2014029004 A1 | 2/2014 |
| WO | WO-2014107790 A1 | 7/2014 |
| WO | WO-2014138846 A1 | 9/2014 |
| WO | WO-2014138847 A1 | 9/2014 |
| WO | WO-2014138851 A1 | 9/2014 |
| WO | WO-2014138859 A1 | 9/2014 |
| WO | WO-2014138860 A1 | 9/2014 |
| WO | WO-2015/192249 A1 | 12/2015 |
| WO | WO-2015192249 A1 | 12/2015 |
| WO | WO-2016026042 A1 | 2/2016 |
| WO | WO-2016183667 A1 | 11/2016 |
| WO | WO-2016183668 A1 | 11/2016 |
| WO | WO-2016207864 A1 | 12/2016 |
| WO | WO-2017152268 A1 | 9/2017 |

OTHER PUBLICATIONS

U.S. Appl. No. 15/739,016, filed Dec. 21, 2017, Three-Fluid Liquid to Air Membrane Energy Exchanger.
U.S. Appl. No. 13/449,598, U.S. Pat. No. 9,810,439, filed Apr. 18, 2012, Energy Exchange System for Conditioning Air in an Enclosed Structure.
U.S. Appl. No. 15/185,180, filed Jun. 17, 2016, Energy Exchange System for Conditioning Air in an Enclosed Structure.
U.S. Appl. No. 13/702,596, U.S. Pat. No. 9,234,665, filed Apr. 15, 2013, Liquid-to-Air Membrane Energy Exchanger.
U.S. Appl. No. 14/957,795, filed Dec. 3, 2015, Liquid-to-Air Membrane Energy Exchanger.
U.S. Appl. No. 13/797,152, U.S. Pat. No. 9,816,760, filed Mar. 12, 2013, Liquid Panel Assembly.
U.S. Appl. No. 15/590,685, filed May 9, 2017, Liquid Panel Assembly.
U.S. Appl. No. 13/797,062, filed Mar. 12, 2013, Membrane Support Assembly for an Energy Exchanger.
U.S. Appl. No. 14/187,413, filed Feb. 24, 2014, Evaporate Cooling System With Liquid-to-Air Membrane Energy Exchanger.
U.S. Appl. No. 13/801,280, U.S. Pat. No. 9,109,808, filed Mar. 13, 2013, Variable Desiccant Control Energy Exchange System and Method.
U.S. Appl. No. 14/804,953, U.S. Pat. No. 9,909,768, filed Jul. 21, 2015, Variable Desiccant Control Energy Exchange System and Method.
U.S. Appl. No. 15/185,155, filed Jun. 17, 2016, Variable Desiccant Control Energy Exchange System and Method.

U.S. Appl. No. 14/192,019, filed Feb. 27, 2014, Energy Exchange Assembly With Microporous Membrane.
U.S. Appl. No. 14/190,715, filed Feb. 26, 2014, Membrane-Integrated Energy Exchange Assembly.
U.S. Appl. No. 14/171,951, filed Feb. 4, 2014, Control System and Method for a Liquid Desiccant Air Delivery System.
U.S. Appl. No. 10/048,797, U.S. Pat. No. 6,684,649, filed Jan. 31, 2002, Enthalpy Pump.
"Aaonaire Energy Recovery Units Users Information Manual", AAON, Inc., (Aug. 2006), 16 pgs.
"Advances in Desiccant-Based Dehumidification", American Standard, TRANE Engineers Newsletter, vol. 34-4, (2005), 8 pgs.
"Chapter 8—Heating, Ventilating, and Air Conditioning (HVAC) Demonstration", HVAC Demonstration, (published prior to Feb. 21, 2014), 16 pgs.
"Dehumidification Solutions", Des Champs Laboratories, Inc., (2001), 18 pgs.
"Desi-WringerTM Precision Desiccant Dehumidification Systems", Des Champs Technologies, (2007), 12 pgs.
"Energy Recovery—Fresh in Air Quality", SEMCO Inc., (published before Apr. 12, 2012), 131 pgs.
"European Application Serial No. 16795582.2, Extended European Search Report dated Nov. 20, 2018", 8 pgs.
"Meeting Programs", ASHRAE Technical Committee, (1997-2001), 13 pgs.
"Two-Wheel Desiccant Dehumidification System—Technology for Dehumidification and Improving Indoor Air Quality", Federal Technology Alert, (Apr. 1997), 24 pgs.
Abdel-Salam, Mohamed R. H., et al., "Performance testing of 2-fluid and 3-fluid liquid-to-air membrane energy exchangers for HVAC applications in cold-dry climates", International Journal of Heat and Mass Transfer, 106, (2017), 12 pgs.
Abdel-Salam, Mohamed R. H., et al., "Performance testing of a novel 3-fluid liquid-to-air membrane energy exchanger (3-fluid LAMEE) under desiccant solution regeneration operating conditions", International Journal of Heat and Mass Transfer, 95, (2015), 14 pgs.
Acker, William, "Industrial Dehumidification: Water Vapor Load Calculations and System Descriptions", HPAC Heating/Piping/Air Conditioning, (Mar. 1999), 49-59.
Bellia, L., et al., "Air Conditioning Systems with Desiccant Wheel for Italian Climates", International Journal on Architectural Science, vol. 1 No. 4, (2000), 193-213.
Bergero, Stefano, et al., "On the performances of a hybrid air-conditioning system in different climatic conditions", Energy 36(8), (2011), 5261-5273.
Bergero, Stefano, et al., "Performance analysis of a liquid desiccant and membrane contactor hybrid air-conditioning system", Energy and Buildings 42, (2010), 11 pgs.
Chant, Eileen E., et al., "A Steady-State Simulation of an Advanced Desiccant-Enhanced Cooling and Dehumidification System", ASHRAE Transactions: Research, (Jul. 1992), 339-347.
Coad, William J., "Conditioning Ventilation Air for Improved Performance and Air Quality", HPAC Heating/Piping/Air Conditioning, (Sep. 1999), 6 pgs.
Diblasio, Robert, "Desicants in Hospitals—Conditioning a Research Facility", Engineered Systems, (Sep. 1995), 4 pgs.
Downing, et al., "Operation and Maintenance for Quality Indoor Air", Proc. of the 7th Symposium on Improving Building Systems in Hot and Humid Climates, Ft. Worth, TX, (Oct. 9, 1990), 5 pgs.
Downing, Chris, "Humidity Control—No Place Like Home", Engineered Systems, (1996), 4 pgs.
Erb, Blake, et al., "Experimental Measurements of a Run-Around Membrane Energy Exchanger (RAMEE) with Comparison to a Numerical Model", ASHRAE Transactions, vol. 115, Part 2, (2009), 689-705.
Fischer, J., et al., "Active Desiccant Dehumidification Module Integration with Rooftop Packaged HVAC Units—Final Report Phase 3B", Oak Ridge National Laboratory, (Mar. 2002), 36 pgs.
Fischer, John C., "Optimizing IAQ, Humidity Control, and Energy Efficiency in School Environments through the Application of Desiccant-Based Total Energy Recovery Systems", IAQ Atlanta: Paths to Better Building Environments/Environmental Effects on Heath and Productivity, (1996), 16 pgs.

(56) References Cited

OTHER PUBLICATIONS

Harriman, III, et al., "Dehumidification and Cooling Loads from Ventilation Air", ASHRAE Journal, (Nov. 1997), 7 pgs.
Harriman, III, et al., "Evaluating Active Desiccant Systems for Ventilating Commercial Buildings", ASHRAE Journal, (Oct. 1999), 7 pgs.
Harriman, III, et al., "New Weather Data for Energy Calculations", ASHRAE Journal, (Mar. 1999), 7 pgs.
Jeong, et al., "Energy Conservation Benefits of a Dedicated Outdoor Air System with Parallel Sensible Cooling by Ceiling Radiant Panels", ASHRAE Transactions, vol. 109, Part 2, (2003), 10 pgs.
Karniadakis, George E., et al., "Mimimum-dissipation transport enhancement by flow destabilization: Reynolds' analogy revisited", J. Fluid Mech vol. 192, (1988), 365-391.
Kosar, Douglas R., et al., "Dehumidification Issues of Standard 62-1989", ASHRAE Journal, (Mar. 1998), 71-75.
Larson, Michael David, et al., "The Performance of Membranes in a Newly Proposed Run-Around Heat and Mositure Exchanger", MS Thesis in Mechanical Engineering, University of Saskatchewan, Saskatoon, Canada, URL: http://libran.usask.ca/theses/available/etd-12192006-094159/umestricted/Larson Thesis.pdf, (Dec. 2006), 177 pgs.
Lepoudre, P., et al., "Channel Flow with Sinusoidal Screen Insert", Dept. of Mech Engineering, Univ. of Saskatchewan, Proc. of the 19th Annual Conference of the CFD Society of Canada, Montreal, (Apr. 2011), 6 pgs.
Mahmud, Khizir, "Design and Performance Testing of Counter-Cross-Flow Run-Around Membrane Energy Exchanger System", MS Thesis in Mechanical Engineering, University of Saskatchewan, Saskatoon, Canada, URL: http://libranusask.ca/theses/ available/etd-09092009-223833/umestricted/KhizirMahmud2009-Sep-28a.pdf, (Sep. 2009), 176 pgs.
Mahmud, Khizir, et al., "Performance testing of a counter-cross-flow run-around membrane energy exchanger (RAMEE) system for HVAC applications", Energy and Buildings, 42, (2010), 9 pgs.
McGahey, Kevin, et al., "Desiccants: Benefits for the Second Century of Air Conditioning", Proc. of the 10th Symposium on Improving Building Systems in Hot and Humid Climates, Ft. Worth, Texas, (May 14, 1996), 9 pgs.
McGahey, Kevin, "New Commercial Applications for Desiccant-Based Cooling", ASHRAE Journal, (Jul. 1998), 41-45.
Mumma, Stanley A., et al., "Achieving Dry Outside Air in an Energy-Efficient Manner", ASHRAE Transactions 2001, vol. 107, Part 1, (2001), 8 pgs.
Mumma, Stanley A., "Dedicated Outdoor Air-Dual Wheel System Control Requirements", ASHRAE Transactions, vol. 107, Part 1, (2001), 9 pgs.
Mumma, Stanley A., et al., "Extension of the Multiple Spaces Concept of ASH RAE Standard 62 to Include Infiltration, Exhaust/Exfiltration, Interzonal Transfer, and Additional Short-Circuit Paths", ASHRAE Transactions: Symposia, (1998), 1232-1241.
Mumma, Stanley A, "Overview of Integrating Dedicated Outdoor Air Systems with Parallel Terminal Systems", ASHRAE Transactions vol. 107, Part 1, (2001), 7 pgs.
Nimmo, B. G., et al., "DEAC: Desiccant Enhancement of Cooling-Based Dehumidification", ASHRAE Transactions: Symposia, (1993), 842-848.
Qin, C. K., et al., "Engine-driven Desiccant-assisted Hybrid Air-conditioning System", 23rd World Gas Conference, Amsterdam, (2006), 15 pgs.
Ryan, K., et al., "Three-dimensional transition in the wake of bluff elongated cylinders", J. Fluid Mech., vol. 538, (2005), 29 pgs.
Scofield, C. Mike, et al., "HVAC Design for Classrooms: Divide and Conquer", Heating/Piping/Air Conditioning, (May 1993), 53-59.
Sevigny, Scoot P., et al., "Air Handling Unit Direct Digital Control System Retrofit to Provide Acceptable Indoor Air Quality and Global Energy Optimization", Energy Engineering, vol. 94, No. 5, (1997), 24-43.

Shank, Kurt M., et al., "Selecting the Supply Air Conditions for a Dedicated Outdoor Air System Working in Parallel with Distributed Sensible Cooling Terminal Equipment", ASHRAE Transactions, vol. 107, Part 1, (2001), 10 pgs.
Smith, Christopher S., et al., "Outdoor Air, Heat Wheels and JC Penny: A New Approach to Retail Ventilation", Proc. of the 11th Symposium on Improving Building Systems in Hot and Humid Climates, Ft. Worth, Texas, (Jun. 2, 1998), 1 pg.
Smith, James C., "Schools Resolve IAQ/Humidity Problems with Desiccant Preconditioning", Heating/Piping/Air Conditioning, (Apr. 1996), 6 pgs.
Sonin, Ain A., et al., "Optimization of Flow Design in Forced Flow Electrochemical Systems, with Special Application to Electrodialysis", Ind. Eng. Chem, Process Des. Develop vol. 13, No. 3, (1974), 8 pgs.
Swails, James F., et al., "A Cure for Growing Pains", Consulting Specifying Engineer, [Online] retrieved from the internet: www.csermag.com, (Jun. 1997), 4 pgs.
Turpin, Joanna, "Dehumidification: The Problem No One Wants to Talk About", URL: http//www.esmagazine.com/copyrighVde12c1c879ba801 0VgnVCM1 00000f932a8c0_?>, (posted on Apr. 5, 2000), 6 pgs.
Vali, Alireza, "Modeling a Run-Around Heat and Moisture Exchanger Using Two Counter/Cross Flow Exchangers", MS Thesis in Mechanical Engineering, University of Saskatchewan, Saskatoon, Canada, URL: http://library.usask.ca/theses/mailable/etd-06032009-15-J.6-J.-1./unrestricted/ Vali.AlirezaThesis.pdf, (2009), 193 pgs.
Vali, Alireza, et al., "Numerical model and effectiveness correlations for a run-around heat recovery system with combined counter and cross flow exchangers", International Journal of Heat and Mass Transfer 52, (2009), 14 pgs.
Woods, J, et al., "Desiccant Enhanced Evaporative Air Conditioning: Parametric Analysis and Design", 2nd International Conference on Building Energy and Environment (COBEE), (Oct. 2012), 10 pgs.
Yborra, Stephen C., "Field Evaluation of Desiccant-Integrated HVAC Systems: A Review of Case Studies in Multiple Commercial/Institutional Building Types", Proc. of the 11th Symposium on Improving Building Systems in Hot and Humid Climates, Ft. Worth, Texas, (Jun. 2, 1998), 10 pgs.
"International Application Serial No. PCT/CA2016/050252, International Search Report dated May 26, 2016", 3 pgs.
"International Application Serial No. PCT/CA2016/050252, Written Opinion dated May 26, 2016", 4 pgs.
"International Application Serial No. PCT/CA2016/050507, International Search Report dated Jul. 21, 2016", 3 pgs.
"International Application Serial No. PCT/CA2016/050507, Written Opinion dated Jul. 21, 2016", 3 pgs.
"International Application Serial No. PCT/CA2017/050180, International Search Report dated Apr. 26, 2017", 3 pgs.
"International Application Serial No. PCT/CA2017/050180, Written Opinion dated Apr. 26, 2017", 4 pgs.
"European Application Serial No. 16795581.4, Extended European Search Report dated Feb. 12, 2019", 9 pgs.
"U.S. Appl. No. 15/574,201, Non Final Office Action dated Jan. 29, 2019", 6 pgs.
U.S. Pat. No. 10,197, 310, filed Jun. 19, 2015, Systems and Methods for Managing Conditions in Enclosed Space.
U.S. Appl. No. 16/230,958, filed Dec. 21, 2018, Systems and Methods for Managing Conditions in Enclosed Space.
"European Application Serial No. 17762365.9, Response filed Apr. 25, 2019 to Communication Pursuant to Rules 161 and 162 dated Oct. 16, 2018", 12 pgs.
"International Search Report and Written Opinion", PCT Search Report, 9 pgs.
"Singaporean Application Serial No. 11201709404P, Written Opinion dated Feb. 22, 2019", in English, 8 pgs.
"U.S. Appl. No. 14/744,950, Ex Parte Quayle Action dated Jul. 3, 2018", 5 pgs.
"U.S. Appl. No, 14/744,950, Non Final Office Action dated Sep. 19, 2017", 20 pgs.
"U.S. Appl. No. 14/744,950, Notice of Allowance dated Sep. 25, 2018", 5 pgs.

(56) References Cited

OTHER PUBLICATIONS

"U.S. Appl. No. 14/744,950, Preliminary Amendment filed Jun. 19, 2015", 7 pgs.
"U.S. Appl. No. 14/744,950, Response filed Mar. 16, 2018 to Non Final Office Action dated Sep. 19, 2017", 14 pgs.
"U.S. Appl. No. 14/744,950, Response filed Jun. 7, 2017 to Restriction Requirement dated Mar. 7, 2017", 12 pgs.
"U.S. Appl. No. 15/814,153, Restriction Requirement dated May 15, 2019", 6 pgs.
"U.S. Appl. No. 14/744,950, Response filed Aug. 31, 2008 to Ex Parte Quayle Action dated Jul. 3, 2018", 8 pgs.
"U.S. Appl. No. 14/744,950, Restriction Requirement dated Mar. 7, 2017", 10 pgs.
"Case Study: Sabey Intergate,Quincy Oasis IEC", Munters Corp., [Online] Retrieved from the internet on Aug. 1, 2016: <URL: https://webdh.munters.com/webdh/BrochureUploads/Case%20Study-%20Sabey-Intergate-Quincy,pdf>, (2016), 2 pgs.
"Chinese Application Serial No. 201580044765.8, Office Action dated Apr. 18, 2019", w/ English Translation, 13 pgs.
"Climate Wizard: How it Works", Seeley Intl., [Online] Retrieved from the internet on Aug. 1, 2016: <URL: http://www.climatewizard.com/how-it-works>, (2016), 3 pgs.
"Coolers & Humidifiers", Munters Oasis IEC-Americas, [Online] Retrieved from the Internet on Aug. 1, 2016: <URL: https://www.munters.com/en/munters/products/coolers—humidifiers/oasis-indirect-evaporative-coolers-iec/>, (2016), 2 pgs.
"Cooling Unit—Cooler Installation and Maintenance Instructions Sizes 14-16", Swegon AB, GB.Cooler.Inst.060501, (2006), 34 pgs.
"Datacom Equipment Power Trends and Cooling Applications", ASHRAE, (2005), 124 pgs.
"Design Considerations for Datacom Equipment Centers", ASHRAE, (2005), 204 pgs.
"European Application Serial No. 15809541.4, Communication Pursuant to Article 94(3) EPC dated Aug. 24, 2018", 5 pgs.
"European Application Serial No. 15809541,4, Extended European Search Report dated Jan. 4, 2018", 7 pgs.
"European Application Serial No. 15809541.4, Response filed Mar. 14, 2019 to Communication Pursuant to Article 94(3) EPC dated Aug. 24, 2018", 15 pgs.
"European Application Serial No. 15809541.4, Response filed Aug. 2, 2018 to Extended European Search Report dated Jan. 4, 2018", 16 pgs.
"European Application Serial No. 15809541,4, Response filed Aug. 3, 2017 to Communication Pursuant to Rules 161(2) and 162 EPC dated Feb. 23, 2017", 4 pgs.
"GEA Adia-Denco: Data center cooling with highest energy efficiency", GEA Group, [Online] Retrieved from the Internet on Aug. 1, 2016: <URL: http://eviss.bg/web/wp-content/uploads/2013/09/GEA-Adia-DENCO-Data-Facts-PDF-33-Mb.pdf>, (Feb 2013), 10 pgs.
"High Performance Data Centers: A Design Guidelines Sourcebook", Pacific Gas and Electric Co., (Jan. 2006), 63 pgs.
"HTK-SE Hybrid Dry Cooler", Jaeggi Hybridtechnologie AG, [Online] Retrieved from the Internet on Aug. 1, 2016: <URL: http://www.jaeggi- hybrid.eu/fileadmin/literature/europe/Jaeggi/HTK_SE/JAEGGI_HTK-SE_Info_EN.pdf>, (Jan. 6, 2014), 11 pgs.
"Indirect Adiabatic and Evaporative Data Centre Cooling", Excool Ltd., [Online] Retrieved from the Internet on Aug. 1, 2016: <URL: http://excool.com/userfiles/files/Excool-Brochure.pdf>, (2016), 12 pgs.
"International Application Serial No. PCT/CA2015/050570, International Preliminary Report on Patentability dated Dec. 29, 2016", 6 pgs.
"International Application Serial No. PCT/CA2015/050570, International Search Report dated Sep. 1, 2015", 4 pgs.
"International Application Serial No. PCT/CA2015/050570, Written Opinion dated Sep. 1, 2015", 4 pgs.
"Kyoto Cooling(r) Utilizes Award-Winning Technology to Re-Invent Computer Room Air Conditioning (CRAC) Units with Release of Series 100", Air Enterprises, [Online] Retrieved from the internet on Dec. 5, 2014: <URL: http://airenterprises.com/?s-series+100&x=0&y-0>(2014), 14 pgs.
"Munters PFC Polymer Fluid Cooler", Munters Corp., (Sep. 2015), 2 pgs.
"Oasis PFC Polymer Fluid Cooler Product Information", Munters Corp., (Nov. 2013), 2 pgs.
"Oasis Product Guide", Munters Corp., [Online] Retrieved from the Internet on Aug. 1, 2016: <URL: https://www.munters.com/globalassets/inriver/resources/product_guide_oasis_europe_web.pdf>, (2016), 12 pgs.
"Operating and Maintenance Instructions for the Gold Air Handling Unit, Sizes 11-52", Swedon AB, GB.GOLDSK.050101, (2005), 74 pgs.
"Series 100—Smarter cooling for data centers", Kyoto Cooling by Air Enterprises, [Online] Retrieved from the Internet: <URL: http://airenterprises.com/wp-content/uploads/2014/05/KyotoCooling-Series100-lowres.pdf>, (2014), 5 pgs.
"Sustainable cooling for data centres", Agentschap NL/NL Agency, Ministry of Economic Affairs, Agriculture and Innovaction, (Jul. 2012), 26 pgs.
"The Coolerado HMX Difference", Seeley Intl., [Online] Retrieved from the Internet on Aug. 1, 2016: <URL: http://www.coolerado.com/products/hmx/>, (2016), 4 pgs.
"The Gold Air Handling Unit, version 4: Operation and Maintenance instructions", PM-Luft, (2000), 60 pgs.
"Thermal Guidelines for Data Processing Environments", ASHRAE, (2004), 55 pgs.
Bonilla, Charles F., "Thermowheel Rotary Air-to-Air Heat Exchanger", Archives of Environmental Health: An International Journal, 4:3, (Mar. 4, 1962), 285-294.
Corbett, Robert J., et al., "Heat Recovery Ventilation for Housing", Superintendent of Documents, U.S. Government Printing Office, Washington, D.C. 20402, (Mar. 1984), 38 pgs.
Pesaran, Ahmad A., "A Review of Desiccant Dehumidification Technology", National Renewable Energy Laboratory, (Oct. 1994), 10 pgs.
Rasmussen, Neil, "Electrical Efficiency Modeling for Data Centers", American Power Conversion White Paper 113, (Oct. 26, 2005), 20 pgs.
Sullivan, Robert F., et al., "Analysis of the KyotoCooling Process: Introduction to the New KPN CyberCenters", Uptime Institute Research Underwriter White Paper, IT Symposium—Lean, Clean & Green, (2009), 13 pgs.
"U.S. Appl. No. 15/574,201, Notice of Allowance dated Aug. 20, 2019", 7 pgs.
"U.S. Appl. No. 15/574,201, Response filed Jul. 29, 2019 to Non-Final Office Action dated Jun. 29, 2019", 12 pgs.
"U.S. Appl. No. 15/814,153, Non Final Office Action dated Oct. 9, 2019", 16 pgs.
"U.S. Appl. No. 15/814,153, Response filed Jul. 15, 2019 to Restriction Requirement dated May 15, 2019", 9 pgs.
"U.S. Appl. No. 16/230,958, Preliminary Amendment filed Jun. 10, 2019", 7 pgs.
"Australian Application Serial No. 2015278221, First Examination Report dated May 20, 2019", 5 pgs.
"Chinese Application Serial No. 201680038134.X, Office Action dated Jul. 8, 2019", w/ English Translation, 30 pgs.
"Chinese Application Serial No. 201680038135.4, Office Action dated Aug. 26, 2019", w/ English Translation, 23 pgs.
"European Application Serial No. 15809541.4, Communication Pursuant to Article 94(3) EPC dated Aug. 26, 2019", 3 pgs.
"European Application Serial No. 16795581.4, Response filed Sep. 11, 2019 to Extended European Search Report dated Feb. 12, 2019", 14 pgs.
"European Application Serial No. 16795582.2, Response filed Jun. 17, 2019 to Extended European Search Report dated Nov. 20, 2018", 16 pgs.
"European Application Serial No. 17762365.9, Extended European Search Report dated Oct. 17, 2019", 8 pgs.
"Singaporean Application Serial No. 11201709404P, Response filed Jul. 22, 2019 to Written Opinion dated Feb. 22, 2019", in English, 62 pgs.

(56) References Cited

OTHER PUBLICATIONS

"U.S. Appl. No. 15/574,201, Non Final Office Action dated Jan. 1, 2015", 8 pgs.

"U.S. Appl. No. 16/083,280, Non Final Office Action dated Jan. 28, 2020", 6 pgs.

"Chinese Application Serial No. 201580044765.8, Response filed Nov. 4, 2019 to Office Action dated Apr. 18, 2019", w/ English Claims, 12 pgs.

"Chinese Application Serial No. 201680038134.X, Response filed Jan. 23, 2020 to Office Action dated Jul. 8, 2019", w/ English claims, 32 pgs.

"Chinese Application Serial No. 201580044765.8, Office Action dated Mar. 3, 2020", w/ English Translation, 5 pgs.

"European Application Serial No. 15809541.4, Response filed Mar. 5, 2020 to Communication Pursuant to Article 94(3) EPC dated Aug. 26, 2019", 21 pgs.

"Chinese Application Serial No. 201680038135.4, Response filed Mar. 10, 2020 to First Office Action dated Aug. 26, 2019", w/ English Translation, 12 pgs.

"Chinese Application Serial No. 201680038135.4, Office Action dated Jun. 28, 2020", English Translation, 25 pgs.

* cited by examiner

SYSTEMS AND METHODS FOR MANAGING CONDITIONS IN ENCLOSED SPACE

CLAIM OF PRIORITY

This application is a U.S. National Stage Filing Under 35 U.S.C. § 371 of International Patent Application Serial No. PCT/CA2016/050507, filed on May 2, 2016, and published on Nov. 24, 2017, as WO 2016/183668 A1, which is a continuation-in-part of International Application No. PCT/CA2016/050252, filed on Mar. 8, 2016, and claims the benefit of U.S. Provisional Patent Application No. 62/162,487, filed on May 15, 2015, the benefit of priority of PCT/CA2016/050252 and U.S. Provisional Patent Application No. 62/162,487 are claimed hereby, and each of which is incorporated by reference herein in its entirety.

BACKGROUND

The present patent application relates to conditioning systems and methods for conditioning the air in an enclosed space, including, for example, a data center.

There are many applications for which controlling the environmental conditions within an enclosed space is important—for example, cooling data centers. A data center usually consists of computers and associated components operating 24 hours a day, 7 days a week. The electrical components in data centers produce a lot of heat, which needs to be removed from the space. Air-conditioning systems in data centers can consume as much as 40% of the total energy.

There are several methods to reduce the air-conditioning system's energy consumption in cooling only applications such as data centers, including, for example, conventional evaporative/adiabatic coolers, including indirect/hybrid designs for space cooling. Two general methods currently used are air-side economizers and water-side economizers. The air-side economizer runs outdoor air into the data center whenever outdoor air conditions are suitable to reject the heat from the data center. Using the air-side economizer can increase the risk of dust accumulation and air contaminants inside the space and may be limited to relatively cold and dry climates. The water-side economizer is usually a cooling tower which cools some or all of the return water in a chilled water loop. Water mineral deposition, micro-organisms and biofilm growth (e.g. *Legionella* bacteria), corrosion of metal components and other maintenance challenges in the tower are some of the drawbacks for the water-side economizer. Also, the water-side economizer application may be limited to relatively hot and dry climates.

Another recent cooling method is using direct evaporative coolers (DEC) to cool buildings and other enclosed spaces. Conventional direct evaporative coolers, although typically more energy efficient than vapor compression systems, have some drawbacks. The supply air temperature coming out of the cooler may be challenging to control and is dependent on the outdoor air temperature and humidity level. The supply air may be excessively humid. These systems need careful maintenance to ensure that bacteria, algae, fungi and other contaminants do not proliferate in the water system and transfer into the supply air stream. Since these systems utilize direct contact between the evaporating liquid water and supply air, carryover of contaminants into the air stream can occur, which can, in turn, lead to reduced indoor air quality, odors and "sick building syndrome." Also, buildup of mineral deposits in the unit and on the evaporative pads can reduce performance and require maintenance.

BRIEF DESCRIPTION OF THE DRAWINGS

In the drawings, which are not necessarily drawn to scale, like numerals may describe similar components in different views. Like numerals having different letter suffixes may represent different instances of similar components, subcomponents of a larger logical or physical system, or the like. The drawings illustrate generally, by way of example, but not by way of limitation, various examples described in the present disclosure.

DETAILED DESCRIPTION

Figure 1:
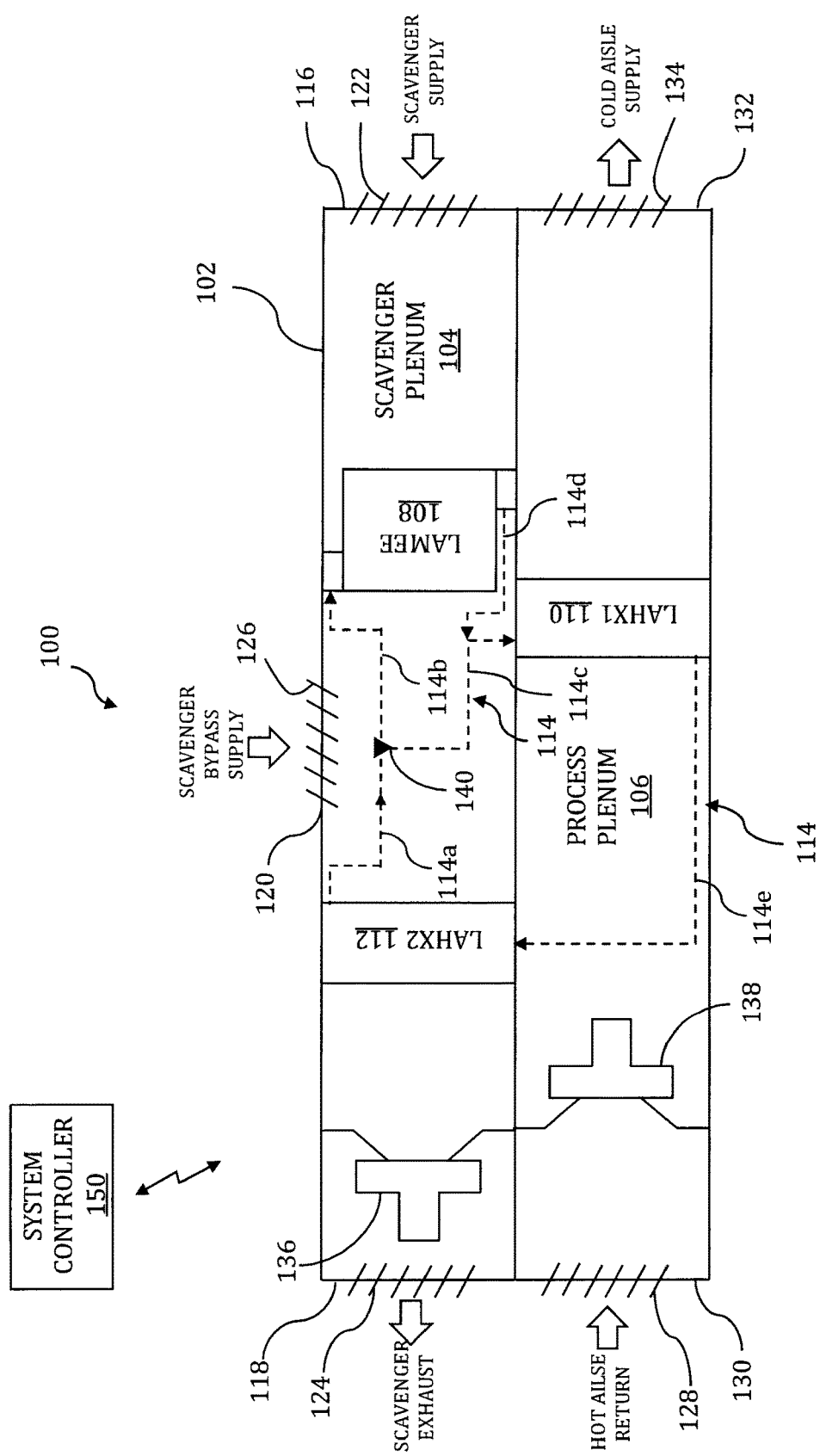
FIG. 1 schematically depicts an example conditioning system with a liquid-to-air membrane energy exchanger and two liquid-to-air heat exchangers.

The inventor(s) recognize, among other things, an opportunity for improved performance in providing cooling to an enclosed space using a Liquid-to-Air Membrane Energy Exchanger (LAMEE) as an evaporative cooler and using the reduced-temperature water from the LAMEE to drive a liquid-to-air heat exchanger (LAHX) to cool the air recirculating through the space. The inventor(s) also recognize an opportunity for improved performance by using a second LAHX to drop some of the heat picked up in the cooling fluid from the air recirculating through the space.

In one example, a system for controlling conditions in an enclosed space includes a scavenger plenum configured to direct scavenger air from a scavenger inlet to a scavenger outlet and a process plenum sealed from the scavenger plenum and configured to direct process air from a process inlet to a process outlet. The process inlet receives heated air from the enclosed space and the process outlet supplies cooled air to the space. The scavenger plenum and the scavenger air flowing there through can be a plenum that transports outdoor air (OA) from an OA inlet through/by a number of conditioning components and then exhausts the heated OA air through an OA outlet. The scavenger and process plenums are sealed from one another such that the scavenger and process air streams do not intermix with one another (other than ordinary leakage between the two plenums, if collocated).

The example conditioning system also includes a LAMEE. The LAMEE is arranged inside the scavenger plenum and is configured to use the scavenger air to evaporatively cool a first fluid flowing through the LAMEE. The temperature of the first cooling fluid at the outlet of the LAMEE is lower than the temperature of the fluid at the LAMEE inlet.

The conditioning system includes a first liquid-to-air heat exchanger or LAHX (LAHX1) arranged inside the process plenum. The LAHX1 directly and sensibly cools the heated air from the enclosed space to a supply air temperature using a second fluid flowing through the LAHX1. The example conditioning system also includes a second LAHX (LAHX2) arranged inside the scavenger plenum downstream of the LAMEE. The LAHX2 receives and cools the second cooling fluid heated by the LAHX1 using the scavenger air.

In some examples, the first fluid flowing through the LAMEE is the same as the second fluid flowing through LAHX1 and LAHX2, including, for example, the cooling fluid flowing through the LAMEE and through LAHX1 and LAHX2 being water. In other examples, the first fluid flowing through the LAMEE is different than the second fluid flowing through LAHX1 and LAHX2. For example, the first fluid flowing through the LAMEE can be water and the second fluid flowing through LAHX1 and LAHX2 can be glycol or other suitable type of refrigerant.

The conditioning system can also include a fluid circuit. The fluid circuit transports the first and second fluids among the LAMEE, LAHX1, and LAHX2.

Examples according to this disclosure can have a number of benefits and/or advantages relative to other systems that condition the air in an enclosed space. For example, the layout of components in the system may be easier to optimize compared to other systems, including systems with a wheel (for example, heat/sensible wheel). Wheel-based systems are generally limited to vertical or horizontal wheel configurations which fix the unit height or width and constrain air tunnel dimensions. Cooling coils or other LAHXs, on the other hand, can be arranged in a variety of ways (vertical, horizontal, slanted, v-bank, multi-segmented, etc.) in order to improve system performance (i.e. reduce face velocity on the coils) and/or to optimize the cabinet layout for size reduction, location of air connections and internal air flow paths. A system without a wheel can easily be made in standard size modules which can be stacked together to construct larger capacity units (i.e. two 200 kW units can be stacked together to make a 400 kW cooling unit). Additionally, including only a single cooling coil or other LAHX, in some examples, in the process air flow can reduce the total pressure drop and fan power for this air stream, which, in turn, can provide significant reductions in annual energy consumption.

Removing the wheel also eliminates potential concerns some customers may have with this type of component, including, for example, wheel air leakage, maintenance, moving parts, corrosion of the wheel media, etcetera. Moreover, without the concern of wheel leakage, the process air fan can be moved upstream of the process-side LAHX, which, in turn, can provide a measure of passive rejection of some of the fan heat.

As noted, examples according to the present application can include integration of a liquid cooling coil or other LAHX downstream of the LAMEE in the scavenger plenum, which can cool the heated water before entering the LAMEE and can boost the system performance. Also, LAHX2 can work as an economizer for the cooling system. Whenever the outdoor air is cold enough to cool the water to a set point temperature, water can bypass the LAMEE and only pass though the scavenger-side LAHX2 before returning to the process-side LAHX1 to cool the air recirculating through the enclosed space. The economizer mode can expand the life of the LAMEE and can save water, as little to no water evaporates when the system operates in the economizer mode.

In some examples, the conditioning system includes a pre-cooler arranged inside the scavenger plenum between the scavenger inlet and the LAMEE. The pre-cooler conditions the scavenger air before it enters the LAMEE.

Conditioning systems in accordance with this disclosure can also include one or more bypass dampers. For example, dampers can be employed to permit scavenger air to enter or exit the scavenger plenum at one or more locations between the scavenger inlet and outlet. In one example, damper(s) may be arranged at the scavenger inlet upstream of all of the components in the scavenger plenum. Second damper(s) can be arranged between the LAMEE and LAHX2 downstream of the LAMEE. In an evaporation mode, in which both the LAMEE and LAHX2 are active and operating, the damper(s) at the scavenger inlet can be opened and the damper(s) between the LAMEE and LAHX2 can be closed to direct scavenger air through the plenum from the inlet, through the LAMEE and LAHX2 to the outlet. In an economizer mode, in which the LAMEE is inactive, the damper(s) at the scavenger inlet can be closed and the damper(s) between the LAMEE and LAHX2 can be opened to direct scavenger air into the plenum between the LAMEE and LAHX2 (thereby bypassing the LAMEE), through the LAHX2 to the scavenger outlet.

Air cooling systems in accordance with this disclosure can be thought of as including two airflow circuits, which are sealed from one another, and at least one cooling fluid circuit, which runs between components in each of the airflow circuits. Examples according to this disclosure can include a first airflow circuit (for example, scavenger air from the outdoor air supply), which transports air from an inlet, through/by one or more system components, and exhausts the air out of the system. This first airflow circuit generally receives air at a first temperature and/or enthalpy and exhausts the air at a second temperature and/or enthalpy, which is higher than the first temperature and/or enthalpy. The air flowing through the first circuit exchanges heat with one or more cooling fluids flowing through cooling components positioned in the pathway of the first airflow stream. The second airflow circuit receives heated return air from the enclosed space at a first temperature, cools the air to a target supply temperature (or within an acceptable tolerance thereof) using fluid cooled by the components arranged in the first airflow circuit, and supplies the cooled air to the enclosed space through a cold air supply outlet. The fluid circuit transports the cooling fluid(s) among at least one evaporative cooler and at least one LAHX in the first airflow circuit, and at least one LAHX in the second airflow circuit.

FIG. 1 depicts an example conditioning system 100. Conditioning system 100 is configured to condition the air in an enclosed space like a data center. Conditioning system 100 is what is sometimes referred to as a 100% recirculation system, which generally means that the air within the enclosed space recirculates through the conditioning system in a continuous cycle of being cooled by the system to a target supply air temperature, supplied to the space, heated by elements in the space (for example, computers, servers, and other electronics), and returned to the system for cooling. Although not shown or described in detail, the conditioning system can include a make-up air unit or system, to continuously or periodically refresh the air within the space.

With the addition of make-up air, in some cases, humidification and/or dehumidification units may be employed to control the humidity of the air in the enclosed space.

In FIG. 1, conditioning system 100 includes system cabinet 102, scavenger plenum 104, process plenum 106, LAMEE 108, LAHX1 110, LAHX2 112, and fluid circuit 114. Scavenger plenum 104 includes inlet 116, outlet 118, and bypass inlet 120. Associated and generally collocated with each of inlet 116, outlet 118 and bypass inlet 120 are dampers 122, 124 and 126, respectively. Process plenum 106 includes inlet 128, with which is associated and collocated damper 130, and outlet 132, which is associated and collocated damper 134.

Air from the enclosed space enters system 100 through process inlet 128. The air entering system 100 has been heated in the enclosed space and requires cooling to a target supply air temperature, which is generally determined based on the amount and characteristics of equipment housed in the enclosed space, for example, computing, networking, data storage and other equipment. Air is supplied to the enclosed space from system 100 through process outlet 132. This supply air is cooled by system 100 and is transported into the space at or within an acceptable tolerance of the target supply air temperature.

Scavenger plenum 104 and the scavenger air flowing therethrough can be a plenum that transports outdoor air (OA) from inlet 116 through/by LAMEE 108 and LAHX2 112, and then exhausts the heated OA air through scavenger outlet 118. The scavenger and process plenums 104 and 106, respectively, are sealed from one another such that the scavenger and process air streams do not intermix with one another (other than ordinary leakage between the two plenums, if collocated).

Scavenger plenum 104 and process plenum 106 are defined by partitioned sub-sections of the interior space of cabinet 102, as is schematically depicted in FIG. 1. In other examples, scavenger and process plenums 104 and 106 can be separate from and mounted within system cabinet 102 of system 100. Although some components of example systems in accordance with this disclosure are schematically depicted as outside of the overall system cabinet and/or outside of the two separate plenums, at least in some examples all of the cooling/conditioning components of example system(s) are located within a single system enclosure, which can be conveniently packaged, transported, and installed. In such cases, the scavenger and process inlets and outlets can be connected directly to or indirectly via appropriate ducting or other fluid flow conduit to additional scavenger air supply and exhaust flow paths and to additional enclosed space supply and return flow paths. Moreover, example systems in accordance with this disclosure can be employed in combination with other heating, cooling, humidification/dehumidification, recovery, regeneration and other components or systems located within or otherwise along these additional scavenger and process air flow paths.

A liquid to air membrane energy exchanger (LAMEE) can be used as part of example conditioning systems to transfer heat and moisture between a liquid and an air stream to condition the temperature and humidity of the air flowing through the LAMEE or to condition the liquid flowing through the LAMEE. In an example, the membrane in the LAMEE can be a non-porous film having selective permeability for water, but not for other constituents that may be present in the liquid. Many different types of liquids can be used in combination with the non-porous membrane, including, for example, water, liquid desiccants, glycols. In an example, the membrane in the LAMEE can be semi-permeable or vapor permeable, and generally anything in a gas phase can pass through the membrane and generally anything in a liquid phase cannot pass through the membrane. In an example, the membrane in the LAMEE can be micro-porous such that one or more gases can pass through the membrane. In an example, the membrane can be a selectively-permeable membrane such that some constituents, but not others, can pass through the membrane. It is recognized that the LAMEEs included in the conditioning systems disclosed herein can use any type of membrane suitable for use with an evaporative cooler LAMEE.

LAMEE 108 in conditioning system 100 can circulate a cooling fluid, which can be an evaporative fluid, through the LAMEE to reduce the temperature of the cooling fluid. LAMEE 108 can operate as an evaporative cooler, using the cooling potential in both air and the cooling fluid (for example, water) to reject heat. In an example, LAMEE 108 can use a flexible polymer membrane, which is vapor permeable, to separate air and water. Relative to other systems/devices, the water flow rate and air flow rate through LAMEE 108 may not be limited by concerns such as droplet carryover at high face velocities. In addition, the LAMEE can operate with water flow rates that enable the transport of thermal energy into the cooler similar to a cooling tower, and the elevated inlet water temperatures can boost the evaporative cooling power of the LAMEE 108.

The cooling fluid circulating through LAMEE 108 can include water, liquid desiccant, glycol, other hygroscopic fluids, other evaporative liquids, and/or combinations thereof. In an example, the cooling fluid is a liquid desiccant that is a low concentration salt solution. The presence of salt can sanitize the cooling fluid to prevent microbial growth. In addition, the desiccant salt can affect the vapor pressure of the solution and allow the cooling fluid to either release or absorb moisture from the air. The concentration of the liquid desiccant can be adjusted for control purposes to control the amount of cooling of the scavenger air or cooling fluid within LAMEE 108.

In an example, the cooling fluid in LAMEE 108 can be water or predominantly water. In conditioning system 100 of FIG. 1, the cooling fluid can be water and LAMEE 108 can include a water inlet and a water outlet for passing water through the exchanger. Other types of evaporative cooling fluids, including those listed above, can be used in combination with water or as an alternative to water in examples according to this disclosure.

LAMEE 108 can be referred to herein as an evaporative cooler and/or an evaporative cooler LAMEE. As scavenger air flows through LAMEE 108, the water, or both the scavenger air and the water, can be cooled to the outside air wet bulb (WB) temperature. The scavenger air exiting LAMEE 108 can pass through LAHX2 112 and scavenger fan 136 and exit scavenger plenum 104 at the outlet thereof as exhaust.

Due to the evaporative cooling process in LAMEE 108, a temperature of the water at the outlet of the exchanger can be less than a temperature of the water at the inlet. In other words, the water flowing through the LAMEE is cooled by the device between the inlet and the outlet. The reduced-temperature, or "cooled" water from LAMEE 108 can be used to provide cooling to process air flowing through LAHX1 110.

LAMEE 108 or other such devices can offer advantages over conventional cooling systems, such as cooling towers, for example. The membrane separation layer in the LAMEE can reduce maintenance, can eliminate the requirement for chemical treatments, and can reduce the potential for contaminant transfer to the liquid loop. The use of LAMEEs along with an upstream and/or downstream cooling coil (or other LAHX) can result in a lower temperature of the water leaving the LAMEE and a higher cooling potential. Various configurations of cooling systems having a LAMEE are described herein and can boost performance in many climates. Higher cooling potential and performance can result in lower air flow and fan power consumption in the cooling system, which is the main source of energy consumption in liquid-cooling systems, and can increase the overall data center cooling system efficiency.

Example conditioning system 100 also includes two liquid-to-air heat exchangers, LAHX1 110 and LAHX2 112, which generally exchange heat between a cooling fluid flowing through the exchanger and air flowing over/by the exchanger. LAHX1 110 is arranged in process plenum 106 and is the cooling component in conditioning system 100 that ultimately directly and sensibly cools the air from the enclosed space. LAHX2 112 is arranged in scavenger plenum 104 and serves multiple purposes. LAHX2 112 can function to recover some of the energy expended on cooling the air from the enclosed space by using the scavenger air to cool the cooling fluid exiting LAHX1 110 and entering LAHX2 112. Additionally, in some examples, LAHX2 112 can be the primary cooling component (for example, when LAMEE 108 is deactivated) for cooling the fluid that enters LAHX1 110.

Both LAHX1 110 and LAHX2 112 can be a variety of kinds of liquid-to-air exchangers, including, for example, cooling coils. Cooling coils are commonly formed of coiled copper tubes embedded in a matrix of fins. A variety of particular configurations, capacities, etcetera can be employed in examples according to this disclosure. Other example LAHXs that can be used include micro-channel heat exchangers. The cooling fluid circulating through one or both of LAHX1 110 and LAHX2 112 can include water, liquid desiccant, glycol, other hygroscopic fluids, other evaporative liquids, and/or combinations thereof. Additionally, the cooling fluid flowing through one or both of LAHX1 110 and LAHX2 112 can be the same as or different than the cooling fluid flowing through LAMEE 108.

Referring again to FIG. 1, conditioning system 100 also includes scavenger fan (or fan array) 136 and process fan (or fan array) 138, which drive the scavenger air and the process air, respectively, through system 100. Example conditioning system 100 and other example systems in accordance with this disclosure can include more or fewer fans than what is shown in FIG. 1. Moreover, the fans can be located in different locations within the system 100 relative to what is shown in FIG. 1. For example, one or both of scavenger fan 136 and process fan 138 can be configured as a single fan or multiple fans, including a fan array, such as, for example, FANWALL® Systems provided by Nortek Air Solutions. Although not shown in the figures, example conditioning systems in accordance with this disclosure can include one or more filters disposed in one or both of scavenger plenum 104 and process plenum 106.

In the example of FIG. 1, scavenger fan 136 is arranged inside scavenger plenum 104 downstream of LAMEE 108 and LAHX2 112. In this position, at least some of the heat generated by scavenger fan 136 is exhausted out of scavenger plenum 104 through scavenger outlet 118, which is just downstream of scavenger fan 136. Process fan 138 is arranged inside process plenum 106 upstream of LAHX1. In this position, some heat generated by process fan 138 can be passively removed. In other examples, scavenger fan 136 can be located at different positions within/along scavenger plenum 104 and process fan 138 can be located at different positions within/along process plenum 106.

In the example of FIG. 1, conditioning system 100 includes fluid circuit 114. Fluid circuit 114 can include a number of different interconnected conduits or fluid flow pathways, as well as other cooling fluid related components, including, for example, valve 140. Fluid circuit 114 can be thought of as including multiple interconnected fluid flow branches or could also be characterized as including multiple fluid circuits. In any event, fluid circuit 114 is structured and configured to transport one or more cooling fluids (or more generally "heat transfer" fluids) among the cooling components of system 100 and other systems in accordance with this disclosure. In the example of FIG. 1, fluid circuit 114 transports one cooling fluid among LAMEE 108, LAHX1 110, and LAHX 112. As the cooling fluid used in system 100 will pass through LAMEE 108, the cooling fluid can be an evaporative fluid. In one example, the cooling fluid used in conditioning system 100 is water or predominantly water.

One branch 114a of fluid circuit 114 transports cooling fluid cooled by LAHX2 112 out of the outlet of LAHX2 112 to valve 140. Depending upon the state of valve 140, the fluid flowing through branch 114a either can flow through branch 114b to the inlet of LAMEE 108 or can flow through branch 114c to the inlet of LAHX1 110 in process plenum 106. Branch 114d of fluid circuit 114 transports fluid from the outlet of LAMEE 108, intermixes with the fluid flowing through branch 114c, and transports the fluid to the inlet of LAHX1 110 in process plenum 106. Finally, branch 114e transports fluid from the outlet of LAHX1 110 in process plenum 106 to the inlet of LAHX2 112 in scavenger plenum 104.

Conditioning system 100 also includes system controller 150. System controller 150 can include hardware, software, and combinations thereof to implement the functions attributed to the controller herein. System controller 150 can be an analog, digital, or combination analog and digital controller including a number of components. As examples, controller 150 can include ICB(s), PCB(s), processor(s), data storage devices, switches, relays, etcetera. Examples of processors can include any one or more of a microprocessor, a controller, a digital signal processor (DSP), an application specific integrated circuit (ASIC), a field-programmable gate array (FPGA), or equivalent discrete or integrated logic circuitry. Storage devices, in some examples, are described as a computer-readable storage medium. In some examples, storage devices include a temporary memory, meaning that a primary purpose of one or more storage devices is not long-term storage. Storage devices are, in some examples, described as a volatile memory, meaning that storage devices do not maintain stored contents when the computer is turned off. Examples of volatile memories include random access memories (RAM), dynamic random access memories (DRAM), static random access memories (SRAM), and other forms of volatile memories known in the art. The data storage devices can be used to store program instructions for execution by processor(s) of controller 150. The storage devices, for example, are used by software, applications, algorithms, as examples, running on and/or executed by controller 150. The storage devices can include short-term and/or long-term memory, and can be volatile and/or non-volatile. Examples of non-volatile storage elements include magnetic hard discs, optical discs, floppy discs, flash memories, or forms of electrically programmable memories (EPROM) or electrically erasable and programmable (EEPROM) memories.

System controller 150 can be configured to communicate with conditioning system 100 and components thereof via various wired or wireless communications technologies and components using various public and/or proprietary standards and/or protocols. For example, a power and/or communications network of some kind may be employed to facilitate communication and control between controller 150 and conditioning system 100. In one example, system controller 150 may communicate with conditioning system 100 via a private or public local area network (LAN), which can include wired and/or wireless elements functioning in accordance with one or more standards and/or via one or more transport mediums. In one example, system 100 can be configured to use wireless communications according to one of the 802.11 or Bluetooth specification sets, or another standard or proprietary wireless communication protocol. Data transmitted to and from components of system 100, including controller 150, can be formatted in accordance with a variety of different communications protocols. For example, all or a portion of the communications can be via a packet-based, Internet Protocol (IP) network that communicates data in Transmission Control Protocol/Internet Protocol (TCP/IP) packets, over, for example, Category 5, Ethernet cables.

System controller 150 can include one or more programs, circuits, algorithms or other mechanisms for controlling the operation of conditioning system 100. For example, system controller 150 can be configured to modulate the speed of scavenger and process fans 136 and 138 and/or control actuation of valve 140 to direct cooling fluid from the outlet of LAHX2 112 to either the inlet of LAMEE 108 or the inlet of LAHX1 110. System controller 150 can also be configured to operate system 100 in an economizer mode in which LAMEE 108 is deactivated, valve 140 is actuated to direct cooling fluid from LAHX2 112 to LAHX1 110, damper 122 is closed, bypass damper 126 is opened, and cooling fluid is circulated through a run-around loop from the outlet of LAHX2 112 to the inlet of LAHX1 110, through LAHX1 110, from the outlet of LAHX1 110 to the inlet of LAHX2 112, and through LAHX2 112 back to the outlet thereof. Additionally, system controller 150 can also be configured to operate system 100 in an evaporation mode in which LAMEE 108 is activated, valve 140 is in a neutral state to direct cooling fluid from LAHX2 112 to LAMEE 108, damper 122 is opened, bypass damper 126 is closed, and cooling fluid is circulated among all of LAMEE 108, LAHX1 110 and LAHX2 112.

Figure 2:
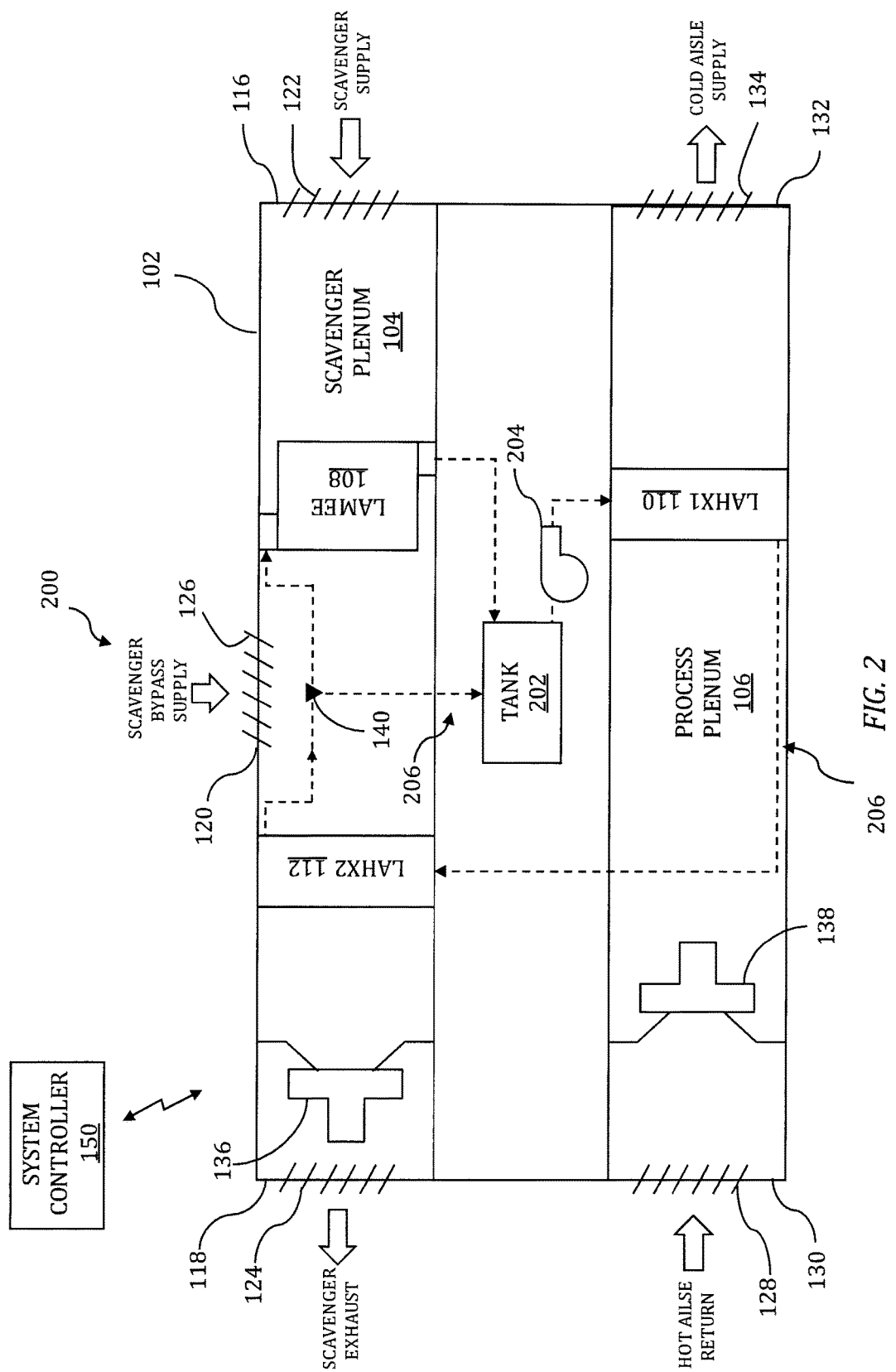
FIG. 2 schematically depicts another example conditioning system having a fluid storage tank.

FIG. 2 depicts another example conditioning system 200. As is apparent from FIG. 2, conditioning system shares many of the components and functions of example conditioning system 100 of FIG. 1. For example, conditioning system 200 includes system cabinet 102, scavenger plenum 104, process plenum 106, LAMEE 108, LAHX1 110, LAHX2 112, and fluid circuit 114. Scavenger plenum 104 includes inlet 116, outlet 118, and bypass inlet 120. Associated and generally collocated with each of inlet 116, outlet 118 and bypass inlet 120 are dampers 122, 124 and 126, respectively. Process plenum 106 includes inlet 128, with which is associated and collocated damper 130, and outlet 132, which is associated and collocated damper 134. Conditioning system 200 also includes scavenger fan 136, process fan 138, valve 140, and system controller 150.

In addition to the components in common with conditioning system 100, conditioning system 200 includes storage tank 202 and pump 204. In this example, storage tank 202 is included in and connected to fluid circuit 206. Fluid circuit 206 can be similar in structure and function to fluid circuit 114 of FIG. 1, except that fluid circuit 206 includes tank 202 and pump 204 and associated couplings to incorporate these components into the circuit.

Storage tank 202 can be employed to store fluid cooled by LAMEE 108. Although not shown in FIG. 2, tank 202 can include a make-up valve and a drain valve to maintain the fluid level and hardness level inside the tank. Tank 202 can include one or more temperature sensors in or around the tank to monitor a temperature of the fluid stored therein. In an example, the control scheme for conditioning system 100 can be based, in part, on a measured temperature of the fluid in tank 202 compared to a set point temperature. In an example, the set point temperature can be pre-determined based on an estimated cooling load from the enclosed space. The set point water temperature can also vary during operation of conditioning system 100, based in part on conditions in the enclosed space (for example, operation of the data center like periodic processing load variations).

Pump 204, which can be controlled by system controller 150, pumps the cooled fluid from storage tank 202 into LAHX1 110, by which LAHX1 110 cools the process air supplied to the enclosed space. After the fluid provides cooling to the process air, the fluid can be recirculated back to LAMEE 108. The fluid will be at an increased-temperature or "heated" when it exits LAHX1 110, because the rejected heat from the process air has been picked up by the fluid. The fluid can then be transported to LAHX2 112 in scavenger plenum 104, which cools the fluid before it returns to LAMEE 108. LAHX2 112 can cool the fluid using the cooling potential of the scavenger air. The scavenger air exiting LAMEE 108 can be relatively cool and additional sensible heat from the cooling fluid can be rejected into the scavenger air.

Fluid circuit 206 can include a number of different interconnected conduits or fluid flow pathways, as well as other cooling fluid related components, including, for example, valve 140. Fluid circuit 206 can be thought of as including multiple interconnected fluid flow branches or could also be characterized as including multiple fluid circuits. In any event, fluid circuit 206 is structured and configured to transport one or more cooling fluids (or more generally "heat transfer" fluids) among the cooling components of system 200. In the example of FIG. 2, fluid circuit 206 transports one cooling fluid, for example, water among LAMEE 108, LAHX1 110, and LAHX2 112, stores the water in tank 202 and is pumped to LAHX1 110 from tank 202 by pump 204.

One branch of fluid circuit 206 transports cooling fluid cooled by LAHX2 112 out of the outlet of LAHX2 112 to valve 140. Depending upon the state of valve 140, the fluid flowing through fluid circuit 206 either can flow to the inlet of LAMEE 108 or can flow into tank 202. Cooling fluid exiting LAMEE 108 is also transported by fluid circuit 206 to tank 202. Pump 204 draws the fluid from tank 202 into LAHX1 110 and the heated (fluid at an increased temperature relative to the temperature at the inlet) fluid from the outlet of LAHX1 110 in process plenum 106 is then transported by fluid circuit 206 to the inlet of LAHX2 108 in scavenger plenum 104.

System controller 150 can be structured and operate in association with conditioning system 200 in a manner similar to that described with reference to conditioning system 100 of FIG. 1. For example, controller 150 can be communicatively connected to system 200, can control operation of components thereof, and can operate the system in multiple modes, including, for example, the economizer mode and the evaporation mode described above.

Figure 3:
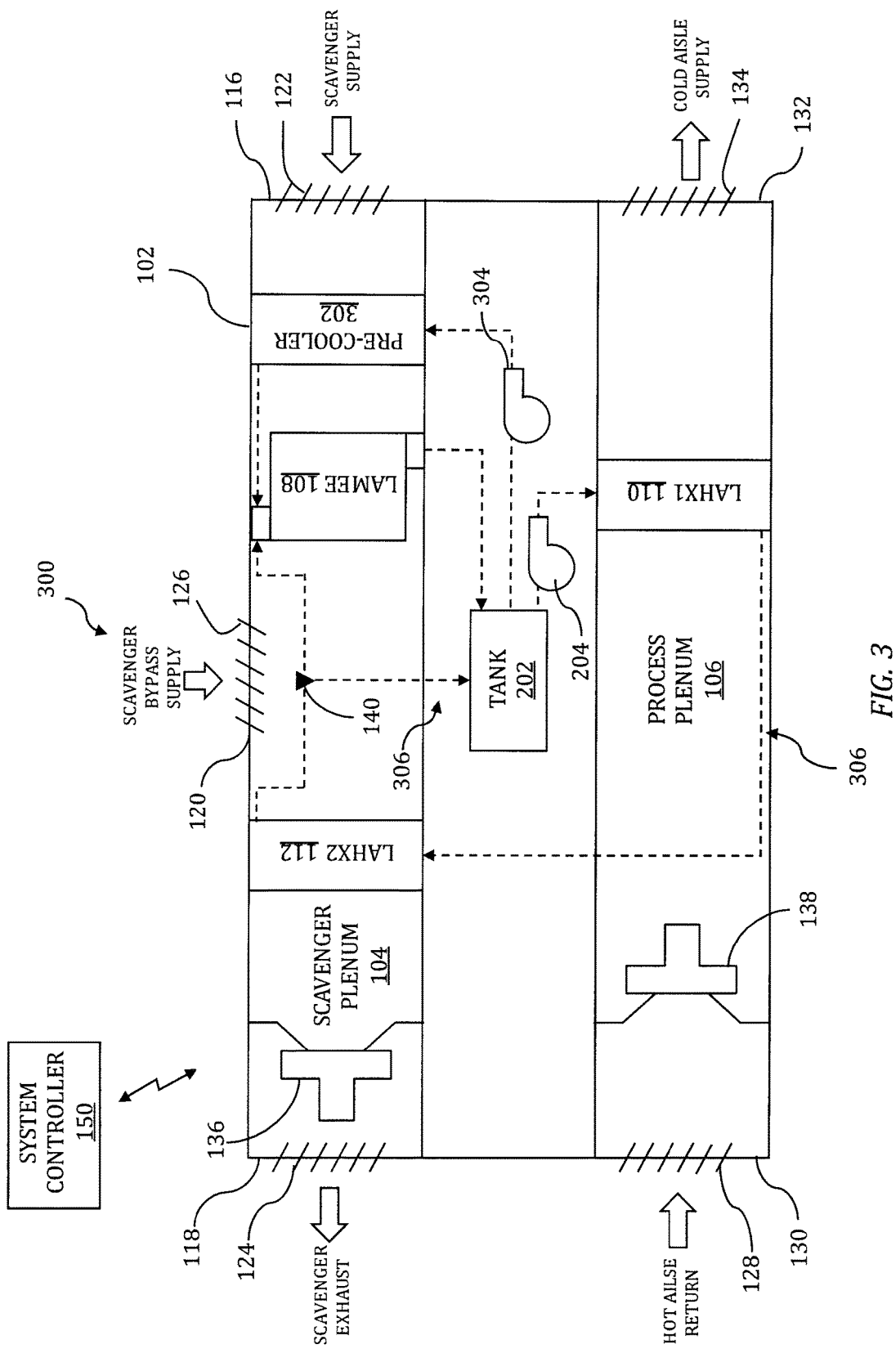
FIG. 3 schematically depicts another example conditioning system having a pre-cooler.

FIG. 3 depicts another example conditioning system 300. Conditioning system 300 shares many of the components and functions of example conditioning system 200 of FIG. 2, and adds pre-cooler 302 and pump 304, which are incorporated into and interconnected with the system via fluid circuit 206. In FIG. 3, conditioning system 300 includes system cabinet 102, scavenger plenum 104, process plenum 106, LAMEE 108, LAHX1 110, and LAHX2 112. Scavenger plenum 104 includes inlet 116, outlet 118, and bypass inlet 120. Associated and generally collocated with each of inlet 116, outlet 118 and bypass inlet 120 are dampers 122, 124 and 126, respectively. Process plenum 106 includes inlet 128, with which is associated and collocated damper 130, and outlet 132, which is associated and collocated damper 134. Conditioning system 200 also includes scavenger fan 136, process fan 138, valve 140, system controller 150, tank 202 and pump 204.

In FIG. 3, conditioning system 300 includes pre-cooler 302. Pre-cooler 302 is arranged in scavenger plenum 104 upstream of LAMEE 108. Pre-cooler 302 can be, for example, a cooling coil that is configured to condition the scavenger air before it enters LAMEE 108. The pre-cooler 302 can pre-cool the scavenger air before it enters LAMEE 108. In some examples, a filter (not shown) can be arranged inside scavenger plenum 104 near the air inlet. A filter can similarly be included in the scavenger plenum of other example conditioning systems in accordance with this disclosure.

In the design shown in FIG. 3, a branch of fluid circuit 306 can transport water (or another heat transfer fluid) from tank 202 to the inlet of pre-cooler 302. The cooling fluid cooled in pre-cooler 302 is transported via fluid circuit 306 from the outlet of the pre-cooler to the inlet of LAMEE 108.

Pre-cooler 302 can be effective when the temperature of the water entering the pre-cooler 302 is lower than the outdoor air dry bulb temperature. Conditioning system 300 can be used in typical summer conditions as well as extreme summer conditions when the outdoor air can be very hot and humid. Pre-cooler 302 can function to depress the outdoor air dry bulb temperature, thus pre-cooling the scavenger air passing through the pre-cooler and heating the water in the pre-cooler 302. The scavenger air and the water can then pass through LAMEE 108, as described above, in which case evaporation occurs and water or both the air and water can be cooled to a temperature approaching the wet bulb temperature of the air leaving the pre-cooler, which is lower than the outdoor air wet bulb temperature. After passing through LAMEE 108, the scavenger air can then pass through LAHX2 112 and thereby cool the heated fluid received by LAHX2 from LAHX1 110.

Conditioning system 300 can allow for three operating modes and selection of the mode can depend, in part, on the outdoor air conditions and a cooling load for the system 300. When the outdoor air is cold, the cooling system 300 can operate in a first mode, an economizer mode, and the pre-cooler 302 and the LAMEE 108 can be bypassed. This economizer or winter mode can be as similarly described above in reference to FIG. 1. Because the scavenger air is cold, this stream of air can sufficiently cool the water as it passes through LAHX2 112, without the need to further cool the water in LAMEE 108 (or pre-cooler 302), as described above with reference to FIG. 1.

In a second operating mode, which can also be referred to as a normal mode or an evaporation mode, the pre-cooler 302 can be bypassed. The evaporation mode can operate during mild conditions, such as spring or fall when the temperature or humidity is moderate, as well as some summer conditions. The scavenger air may be able to bypass the pre-cooler 302, while still meeting the cooling load. Additional bypass dampers can be included in the system 300 to allow the scavenger air to bypass the pre-cooler 302, or alternatively the scavenger air can pass through or around the pre-cooler 302 which is deactivated, and then pass through the LAMEE 108 and the LAHX 112.

In a third operating mode, which can also be referred to as an enhanced mode or a super evaporation mode, the cooling system 300 can run using both the pre-cooler 302 and the LAHX2 112. Under extreme conditions, or when the outdoor air is hot or humid, the cooling system 300 can provide pre-cooling to the scavenger air, using the pre-cooler 302, before the scavenger air enters the LAMEE 108. The pre-cooler 302 can be used to improve the cooling power of the system 300, allowing the LAMEE 108 to achieve lower discharge temperatures at the outlet of the LAMEE 108. The pre-cooler 302 can reduce or eliminate a need for supplemental mechanical cooling.

Additionally, in some cases, pre-cooler 302 may be activated to provide the scavenger-side cooling of the fluid (for example, water), without cooling being provided by LAMEE 108 and instead of or in addition to cooling of the fluid provided by LAHX2 112. In the case in which pre-cooler 302 is active and both LAMEE 108 and LAHX2 112 are inactive (or the scavenger air bypasses the LAMEE and LAHX2), pre-cooler 302 can use the cold scavenger air to cool the water (or other heat transfer fluid) such that the water can exit the pre-cooler 302 at a reduced temperature and be recirculated back to tank 202, without having to be cooled in LAMEE 108 or LAHX2 112. In this case, the configuration of fluid circuit 306 may include branches, valves, etcetera to selectively transport water from the outlet of pre-cooler 302 either to the inlet of LAMEE 108 or back to tank 202. Additionally, appropriate dampers can be included in conditioning system 300, for example, to allow scavenger air to pass through pre-cooler 302 and to bypass LAMEE 108 and/or LAHX2 112 before being exhausted out of the outlet of scavenger plenum 104.

Figure 4:
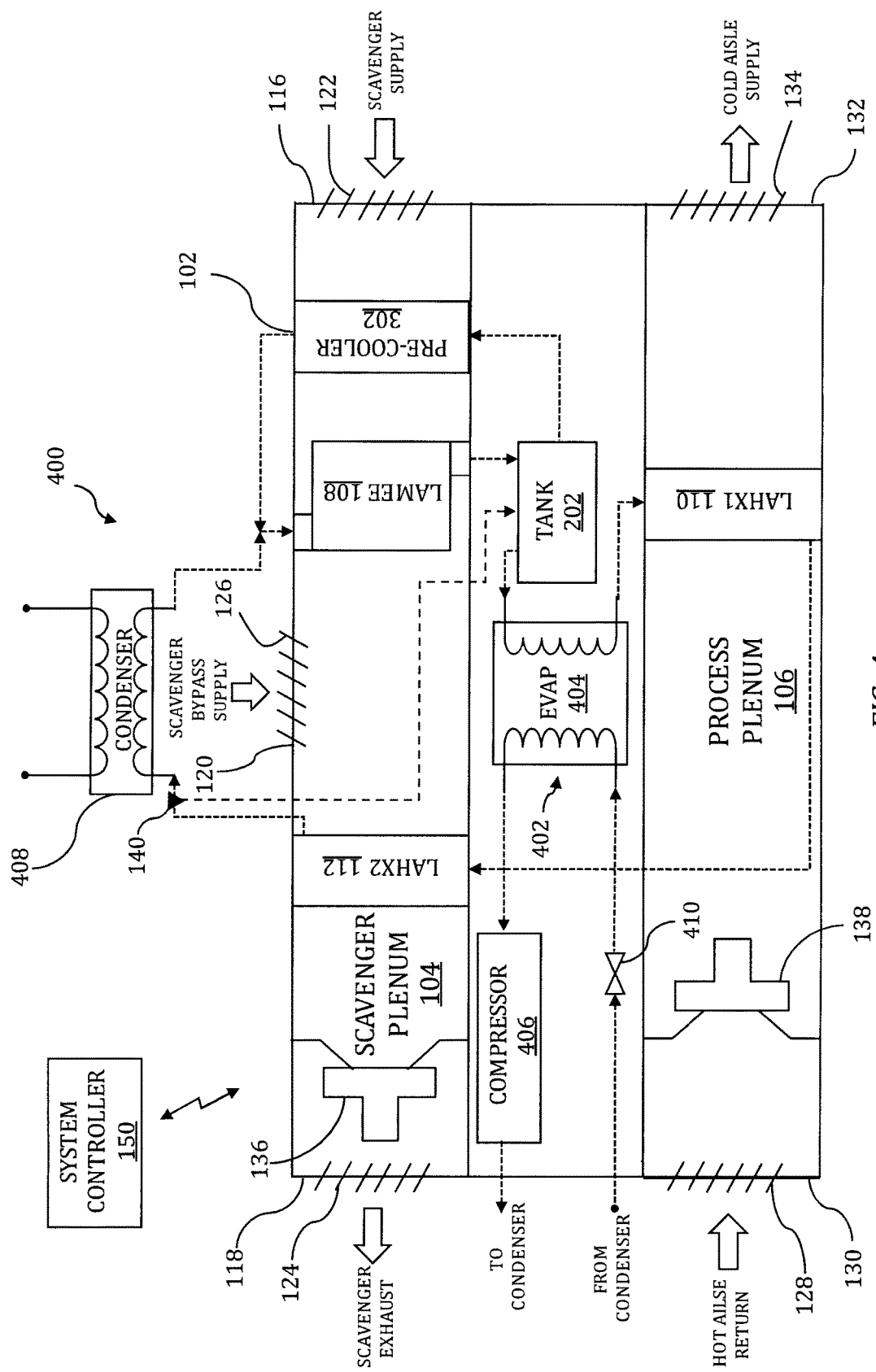
FIG. 4 schematically depicts another example conditioning system having a mechanical cooling system with a liquid-cooled condenser.
Figure 5:
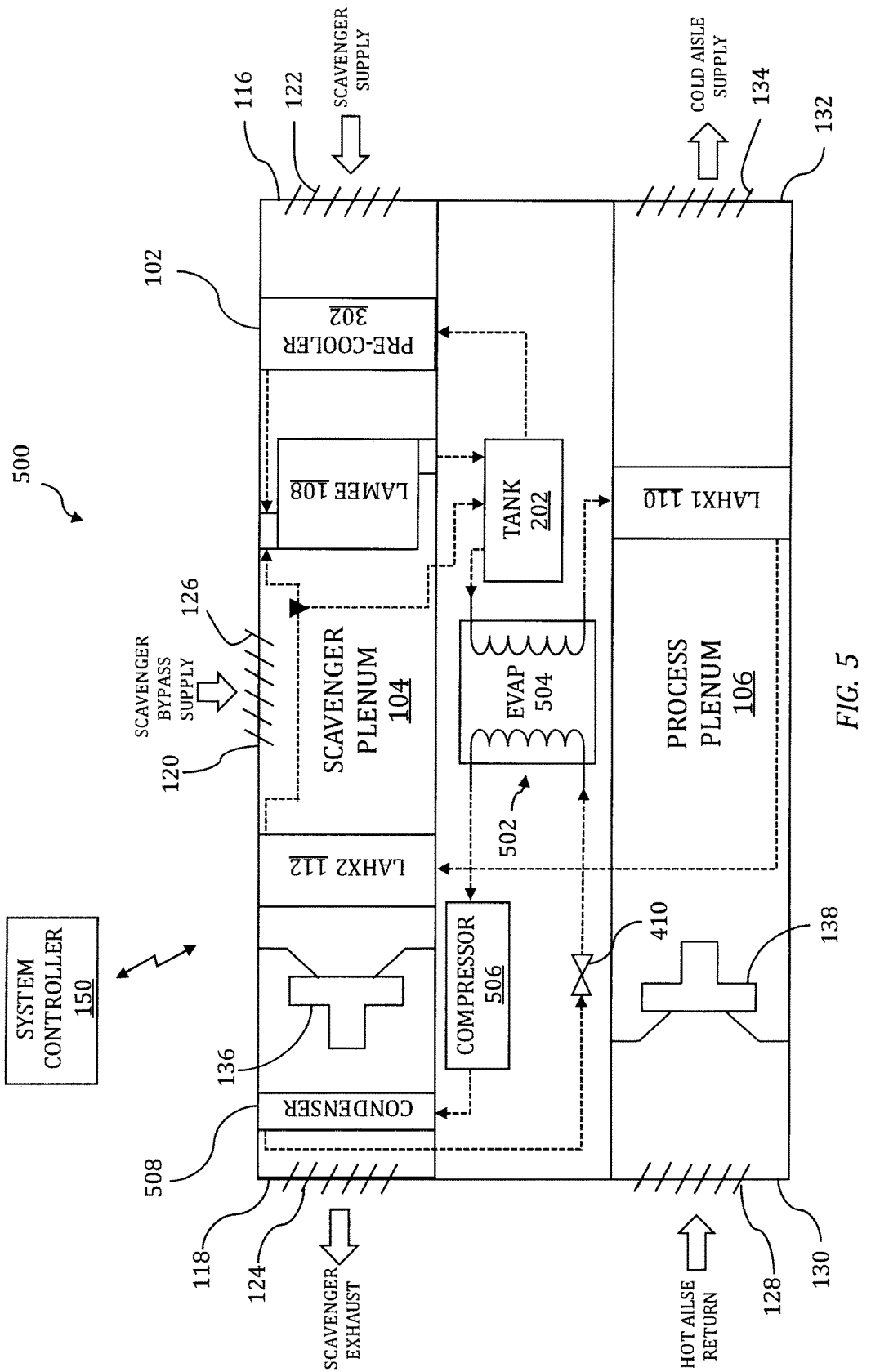
FIG. 5 schematically depicts another example conditioning system having a mechanical cooling system with an air-cooled condenser.

FIGS. 4 and 5 depict two other example conditioning systems 400 and 500. Conditioning systems 400 and 500 share many of the components and functions of example conditioning system 300 of FIG. 3, and each adds a mechanical cooling system to the fluid circuit to provide cooling to the water (or other fluid) stored in tank 202. The mechanical cooling system included in conditioning system 400 of FIG. 4 includes a water-cooled condenser, while the mechanical cooling system included in conditioning system 500 of FIG. 5 includes an air-cooled condenser.

In FIG. 4, conditioning system 400 includes system cabinet 102, scavenger plenum 104, process plenum 106, LAMEE 108, LAHX1 110, LAHX2 112, and DX unit 402. Scavenger plenum 104 includes inlet 116, outlet 118, and bypass inlet 120. Associated and generally collocated with each of inlet 116, outlet 118 and bypass inlet 120 are dampers 122, 124 and 126, respectively. Process plenum 106 includes inlet 128, with which is associated and collocated damper 130, and outlet 132, which is associated and collocated damper 134. Conditioning system 400 also includes scavenger fan 136, process fan 138, valve 140, system controller 150 and tank 202. Pumps to facilitate transport of cooling fluid through system 400 have been omitted from FIG. 4, but the appropriate number and arrangement of such pumps could be included in this and other conditioning systems in accordance with this disclosure.

In FIG. 4, conditioning system 400 includes DX or direct expansion unit 402. A conditioning system having pre-cooler 302, as shown in FIG. 4, in combination with a DX unit 402 can be used, for example, in extreme outdoor air conditions. If the temperature in tank 202 is higher than a target set point temperature (to cover 100% of the load), DX unit 402 can cool the water to the target set point temperature. Thus, DX unit 402 can provide additional cooling of the water (or other fluid) leaving tank 202 so that the water can be sufficiently cool to cover the heating/cooling load for the enclosed space.

DX unit 402 includes evaporator 404, compressor 406, condenser 408 and expansion valve 410. DX unit 402 is configured to cool the water in tank 202 using, for example, a condensed refrigerant liquid. In operation, DX unit 402 cools the water or other fluid in tank 202 by passing the condensed refrigerant through one side of a first heat exchanger, evaporator 404, which cools the water flowing through the other side of evaporator 404. In evaporator 404, the refrigerant expands as it absorbs heat, eventually converting to a gas. DX unit 402 then pumps the refrigerant to compressor 406, which compresses the gas refrigerant and passes it through another heat exchanger, condenser 408. The heat that is absorbed by the refrigerant can be exhausted, and the cooled, compressed refrigerant is once again in liquid form. DX unit 402 then pumps (or otherwise transports) the cooled refrigerant liquid back to evaporator 404 through expansion valve 410 and the cycle begins again.

In the example of FIG. 4, condenser 408 is a water-cooled condenser arranged in scavenger plenum 104 between LAMEE 108 and LAHX2 112. Condenser 408 is a heat exchanger through which flows the refrigerant of DX unit 402 and the water (or other fluid) exiting LAHX2 112. The water is cooled in LAHX2 112 by the scavenger air flowing through scavenger plenum 104, as described with reference to other examples. The cooled water from LAHX2 112 is transported by the fluid circuit of conditioning system 400 to and flows through condenser 408. The cooled water cools the compressed refrigerant flowing through the other side of compressor 408 and the cooled refrigerant flows back to evaporator 404 through expansion valve 410. The water exiting condenser 408, which has been partially heated relative to the water leaving LAHX2 112, is conveyed to the inlet of LAMEE 108, for example, after mixing with water cooled by pre-cooler 302, which is also conveyed to the inlet of the LAMEE 108.

As with at least some other examples in accordance with this disclosure, conditioning system 400 can be operated in multiple modes depending upon various factors, including the heat load from the enclosed space and/or the outdoor air (or incoming scavenger air) conditions. For example, system controller 150 can be configured to control elements of system 400 (and other example systems in accordance with this disclosure) to operate differently in different modes. System controller 150 can be configured to operate system 400 in an economizer mode and evaporation mode, as well as other modes. In the economizer mode, generally, there is sufficient cooling capacity in the outdoor air entering the system that LAHX2 112 (or pre-cooler 302 with a slightly modified fluid circuit) can cool the water or other fluid with the scavenger air without cooling by LAMEE 108 being required. In the evaporation mode, for example, pre-cooler 302, LAMEE 108 and LAHX2 112 may all be activated and used to cool the water flowing through the system using the scavenger air passing through scavenger plenum 104.

In one example, system controller 150 is configured to cause conditioning system 400 to operate in the evaporation mode. In this mode, for example, outdoor scavenger air is drawn into and through scavenger plenum 104 by fan 136. The outdoor air passes through and is cooled by pre-cooler 302 using fluid delivered to the inlet of the pre-cooler by a fluid circuit from tank 202. The cooled outdoor air then flows through and evaporatively cools the fluid flowing through LAMEE 108. The cooling fluid is delivered to the LAMEE 108 by the fluid circuit from the outlet of water-side of condenser 408 and from the outlet of pre-cooler 302. The scavenger air passes LAMEE 108 and flows through LAHX2 112. LAHX2 112 receives fluid from the outlet of LAHX1 110 and the scavenger air cools the heated fluid received from LAHX1 110. Fan 136 then exhausts the scavenger air out of outlet 118 of scavenger plenum 104.

The water or other evaporative cooling fluid cooled by LAMEE 108 is transported by the fluid circuit to tank 202, which stores the water. As described above, DX unit 402 can be activated to cool the water or other fluid stored in tank 202 to keep the fluid at a target set point temperature. From tank 202, the water is transported to the inlet of pre-cooler 302 and to the inlet of the water-side of evaporator 404. The water is transported from the outlet of the water-side of evaporator 404 to LAHX1 110. LAHX1 110 cools the heated process air returned to process plenum 106 from the enclosed space using the water cooled by LAHX2 112.

Still in the evaporation mode, the water flows from the outlet of LAHX1 110 in process plenum 106 to the inlet of LAHX2 112 in scavenger plenum 104. System controller 150 can, in the evaporation mode, activate or not activate valve 140 (depending upon the default state of the valve) to cause the water from the outlet of LAHX2 112 to flow into the water-side of condenser 408. The water exits condenser 408 and returns to the inlet of LAMEE 108.

System controller 150 can also be configured to cause conditioning system 400 to operate in the economizer mode. For example, in the economizer mode, system controller 150 can cause pre-cooler 302, LAMEE 108 and likely DX unit 402 to be deactivated and/or cause the scavenger air to bypass the pre-cooler 302 and the LAMEE 108. In this mode, as described with reference to other examples in accordance with this disclosure, LAHX2 112 cools the water using the scavenger air and transports the water to LAHX1 110 via valve 140, tank 202, and the water-side of evaporator 404.

FIG. 5 depicts another example conditioning system 500. The primary substantive difference between conditioning system 400 of FIG. 4 and conditioning system 500 of FIG. 5 is that DX unit 402 of conditioning system 400 includes a water-cooled condenser 408, while DX unit 502 of conditioning system 500 includes an air-cooled condenser 508. DX unit 502 can be employed in system 500 to maintain cooling fluid stored in tank 202 at a target set point temperature.

In FIG. 5, DX unit 502 includes evaporator 504, compressor 506, air-cooled condenser 508, and expansion valve 510. Air-cooled condenser 508 is arranged in scavenger plenum 104 downstream of LAHX2 112 and, in some examples, downstream of fan 136, close to outlet 118 of scavenger plenum 104. Compressed refrigerant is transported by the fluid circuit of DX unit 502 from compressor 506 to condenser 508. The scavenger air flowing through scavenger plenum 104 passes through and cools the refrigerant flowing through condenser 508.

Although the condenser 508 is shown inside the plenum 104 in FIG. 5, the condenser 508 can be located outside of the plenum 104 and outside of the cabinet 102. The condenser 508 can be located external to the cabinet 102, and this design can be used, for example, in climates typically having mild outdoor air conditions. The condenser 508 can use outdoor air, which in some cases can be at a lower temperature than scavenger air passing through the condenser 508 in the plenum 104 as shown in FIG. 5. If the condenser 508 is located external to the cabinet 102, it is recognized that additional components may be included with the condenser 508, for example, one or more fans.

Conditioning systems 400 and 500 can include multiple cooling fluids and associated cooling fluid circuits. For example, the refrigerant flowing through DX unit 502 can be a first cooling fluid and the conduits and other components for conveying the refrigerant can be a first or a first portion of a fluid circuit. The second cooling fluid flowing through pre-cooler 302, LAMEE 108, LAHX1 110 and LAHX2 112 can be water or predominantly water. A separate or a portion of a larger fluid cooling circuit (for example, conduits, valves, pumps, filters, etcetera) can be employed to transport the water among the various components in conditioning systems 400 and 500. The two cooling fluid circuits or two portions of one circuit are fluidically isolated from one another such that the first and second cooling fluids do not intermix.

Figure 6:
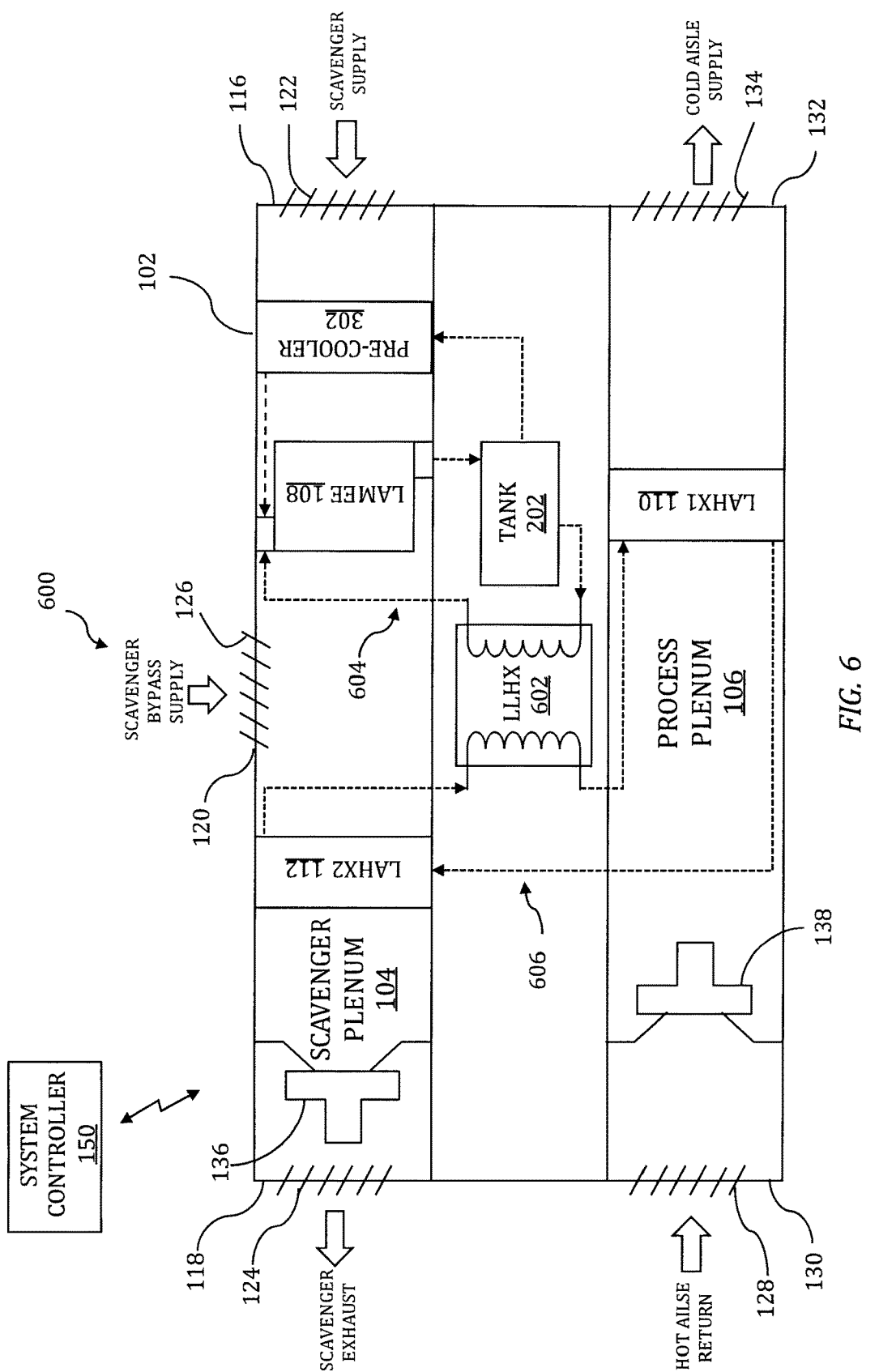
FIG. 6 schematically depicts another example conditioning system having a liquid-to-liquid heat exchanger.

FIG. 6 depicts another example conditioning system 600 including a liquid-to-liquid heat exchanger (LLHX) 602. Conditioning system 600 has many components and functions in common with the above-described examples. For example, in FIG. 6, conditioning system 600 includes system cabinet 102, scavenger plenum 104, process plenum 106, LAMEE 108, LAHX1 110 and LAHX2 112. Scavenger plenum 104 includes inlet 116, outlet 118, and bypass inlet 120. Associated and generally collocated with each of inlet 116, outlet 118 and bypass inlet 120 are dampers 122, 124 and 126, respectively. Process plenum 106 includes inlet 128, with which is associated and collocated damper 130, and outlet 132, which is associated and collocated damper 134. Conditioning system 600 also includes scavenger fan 136, process fan 138, system controller 150 and tank 202. Pumps to facilitate transport of cooling fluids through system 600 have been omitted from FIG. 6, but the appropriate number and arrangement of such pumps could be included in this and other conditioning systems in accordance with this disclosure.

In the example of FIG. 6, conditioning system LLHX 602, which is configured and arranged to use the water or other first cooling fluid coming from LAMEE 108, via a first fluid circuit 604 and tank 202, to cool a second cooling fluid flowing through the LLHX 602, LAHX1 110 AND LAHX2 112 via fluid circuit 606. Employing LLHX 602 in conditioning system 600 can have a number of advantages, including, for example, reducing the risk of freezing in the fluid circuit 606 in winter economizer mode, because the second cooling fluid can be glycol or another fluid with anti-freeze properties.

Water cooled by LAMEE 108 is transported via fluid circuit 604 from the outlet of the LAMEE to tank 202. The cooled water leaves tank 202 and enters the first side of LLHX 602 (for example, the water side of the LLHX). The second fluid can enter the LLHX 602 through an input line of fluid circuit 606 and exit and be transported via another portion of circuit 606 to LAHX1. The coolant can be any suitable heat transfer fluid, and, in some cases, can include anti-freeze to minimize the risk of the coolant freezing in the winter. The cooled water flowing through the water side of LLHX 602 cools the second cooling fluid flowing through the second side of the LLHX. The cooled second cooling fluid is then transported to LAHX1 110, which uses the second cooling fluid to cool the heated process air received in process plenum 106 from the enclosed space. LAHX1 110, as described with other examples, is configured to cool the process air to a target supply air temperature.

After being used to cool the process air, the higher-temperature (also referred to as heated) coolant can be transported via fluid circuit 606 from an outlet of LLHX 602 in process plenum 106 to the inlet of LAHX2 112 in scavenger plenum 104. The scavenger air flowing through scavenger plenum 106 cools the heated second cooling fluid, after which the second cooling fluid recirculates back to the second side of LLHX 602. The reduced-temperature water from the tank 222 can cool the higher-temperature coolant in the LLHX 602 such that the coolant can exit the LLHX 602 at a lower temperature and be returned to the data center 202. The higher-temperature water exiting the LLHX 602 can be delivered to the dry coil 212 through a water line 248. The water can be cooled in the dry coil 212 and returned to the exchanger 210 or the tank 222 as described above in reference to the system 201 of FIG. 1.

LLHX 602 can be located physically in system cabinet 102, but outside of plenums 104 and 106. In some examples, LLHX 602 may be located in either scavenger plenum 104 or process plenum 106. Additionally, LLHX 602 can be located separate from system cabinet 102 and plenums 104 and 106, in which case pumps or other mechanisms may be employed to transport cooling fluids among the LLHX and the other components of conditioning system 600.

Although not shown in the example of FIG. 6, conditioning system 600 could also include a mechanical cooling system like a DX unit to provide cooling to the water or other cooling fluid stored in tank 202 or to the second cooling fluid circulating between the LLHX 602, LAHX1 110 and LAHX2 112. Such a DX unit can be coupled to and function in concert with conditioning system 600 in a manner similar to that described with reference to conditioning systems 400 and 500 of FIGS. 4 and 5, respectively. Additionally, in examples according to this disclosure, conditioning system 600 may be configured with LLHX, with or without an additional mechanical cooling system, and without pre-cooler 302.

System controller 150 can be configured to control operation of conditioning system 600 in multiple modes. A first or evaporation mode is described above, in which all of the components of conditioning system are active and providing cooling, including LAMEE 108 providing evaporative cooling of the first fluid flowing there through.

Additionally, system controller 150 can operate conditioning system 600 in an economizer mode. In the economizer mode, for example, system controller 150 can cause pre-cooler 302 and LAMEE 108 to be deactivated and/or cause the scavenger air flowing through scavenger plenum 104 to bypass the pre-cooler 302 and the LAMEE 108. For example, system controller 150 can cause damper 122 to close and cause bypass damper 126 to open in the economizer mode. In this mode, LLHX 602 is generally inactive and the second cooling fluid is circulated via second fluid circuit 606 in a run-around loop between LAHX1 110 and LAHX2 112. LLHX2 112 cools the second cooling fluid using the scavenger air and transports the second fluid to LAHX1 110, which uses the cooled second fluid to cool the heated process air received from the enclosed space.

Conditioning system 600 includes multiple cooling fluids and associated cooling fluid circuits 604 and 606. The first cooling fluid, for example, water or predominantly water flows through LAMEE 108, pre-cooler 302 and LLHX 602 (at least in evaporation mode in which the LAMEE is activated to provide evaporative cooling). The second cooling fluid, for example, glycol flows through LAHX1 110, LAHX2 112 and LLHX 602, the second cooling fluid being used in both the evaporation and the economizer modes of operation.

Figure 7:
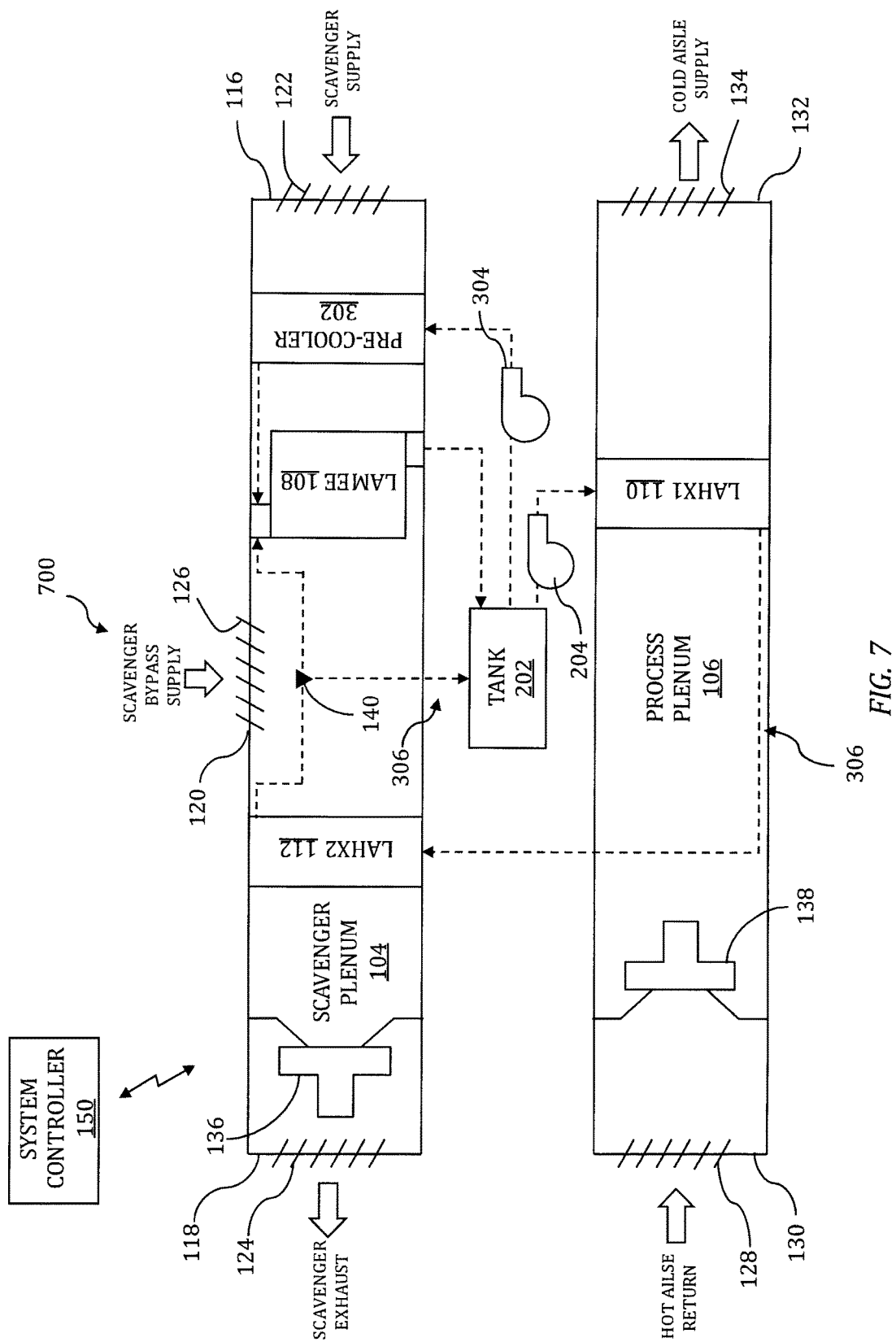
FIG. 7 schematically depicts another example conditioning system including separately located scavenger and process air plenums.

FIG. 7 depicts another example conditioning system 700 in accordance with this disclosure. In some examples, the scavenger air circuit and the process air circuit, instead of being commonly housed/packaged and collocated, may be separated by some distance. Example conditioning system 700 of FIG. 7 is substantially the same as conditioning system 200 of FIG. 2, except that conditioning system 700 does not include a system cabinet 102 housing the scavenger and process air circuits (and, in some cases, the fluid circuit(s)). In the example of FIG. 7, instead, scavenger plenum 104 and the associated components and process plenum 106 and the associated components are separately located and separated from one another by some distance. Although this example, in terms of componentry and functionality, is modeled after the example of FIG. 2, other example conditioning systems in accordance with this disclosure could also be so arranged and configured. For example, any of conditioning systems 100, 300, 400, 500 and 600 could also include scavenger and process air circuits (for example, plenum, cooling components, fluid circuits or portions thereof, etcetera) that are separate and located at a distance from one another.

Figure 8:
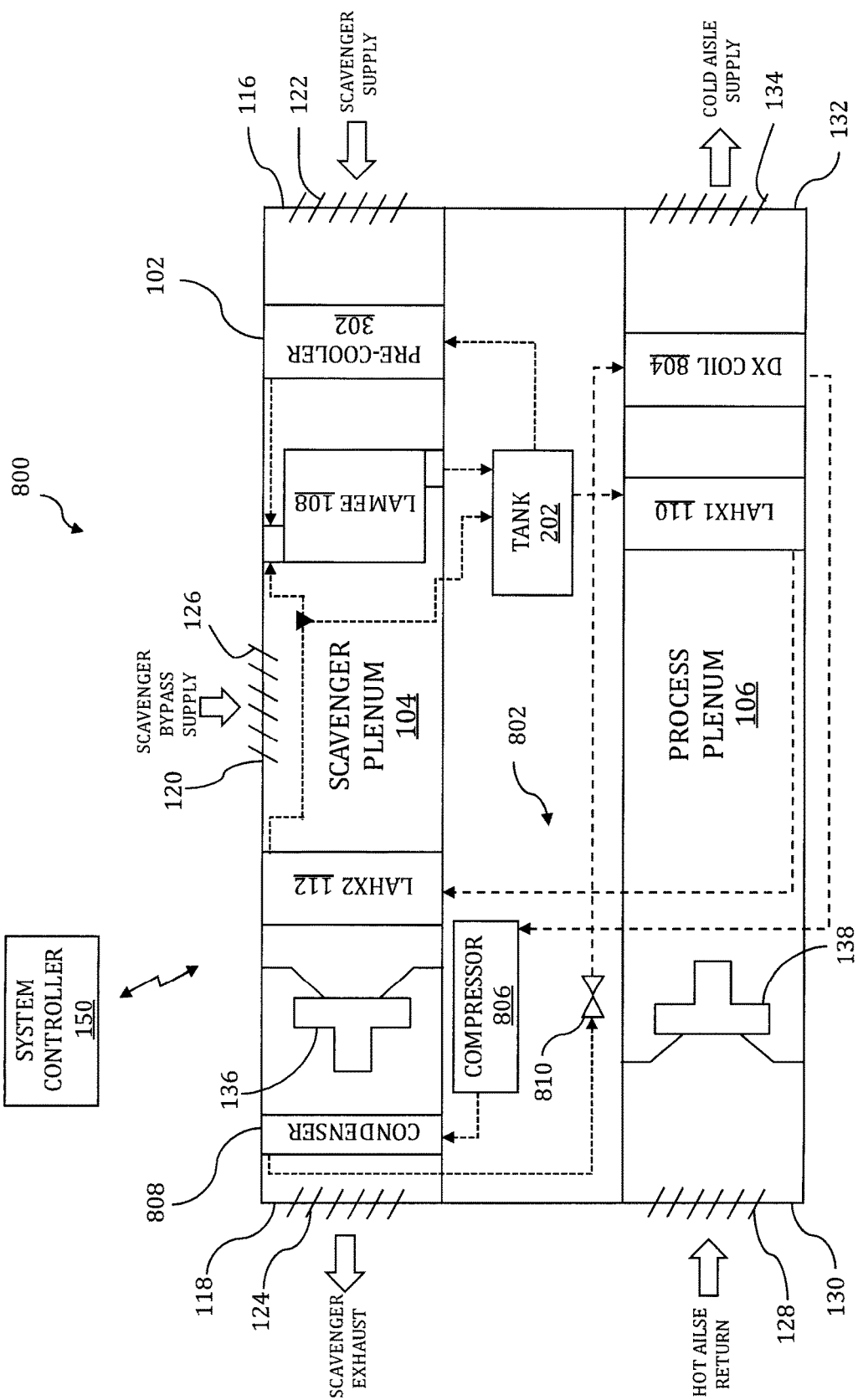
FIG. 8 schematically depicts another example conditioning system including supplemental mechanical cooling of the process air.

FIG. 8 depicts another example conditioning system 800. Conditioning system 800 shares many of the components and functions of example conditioning systems 400 and 500 of FIGS. 4 and 5, except that system 800 employs a mechanical cooling system 802 to supplemental cooling to the process air flowing through process plenum 106. Mechanical cooling system 802 includes an air-cooled condenser 808, but, in another example, a water-cooled condenser could be employed in conditioning system 800.

Mechanical cooling of the process air can function to provide needed cooling in certain outdoor or other conditions. Additionally, if the water cooling system or components thereof, for example, LAMEE 108, LAHX1 110, and/or LAHX2 112, malfunction or go offline for some reason, mechanical cooling system 802 may be employed to provide all the required cooling of the heated process air received from the enclosed space to the target supply air temperature.

In FIG. 8, conditioning system 800 includes system cabinet 102, scavenger plenum 104, process plenum 106, LAMEE 108, LAHX1 110, LAHX2 112, and mechanical cooling system 802. Scavenger plenum 104 includes inlet 116, outlet 118, and bypass inlet 120. Associated and generally collocated with each of inlet 116, outlet 118 and bypass inlet 120 are dampers 122, 124 and 126, respectively. Process plenum 106 includes inlet 128, with which is associated and collocated damper 130, and outlet 132, which is associated and collocated damper 134. Conditioning system 400 also includes scavenger fan 136, process fan 138, valve 140, system controller 150 and tank 202. Pumps to facilitate transport of cooling fluid through system 400 have been omitted from FIG. 8, but the appropriate number and arrangement of such pumps could be included in this and other conditioning systems in accordance with this disclosure.

Conditioning system 800 includes DX unit 802 (or some other similar mechanical cooling system). DX unit 802 includes DX coil 804, compressor 806, condenser 808 and expansion valve 810. DX coil 804 is arranged downstream of LAHX1 110 in process plenum 106. DX unit 802 is configured to cool the process air flowing through process plenum 106 using, for example, a condensed refrigerant liquid. In operation, DX unit 802 cools the process air by passing the condensed refrigerant through the coil, which cools the process air and causes the refrigerant to expand as it absorbs heat, eventually converting to a gas. DX unit 802 then pumps the refrigerant to compressor 806, which compresses the gas refrigerant and passes it through another heat exchanger, condenser 808 arranged in scavenger plenum 104. The scavenger air cools the refrigerant flowing through condenser 808, after which the cooled, compressed refrigerant is once again in liquid form. DX unit 802 then pumps (or otherwise transports) the cooled refrigerant liquid back to DX coil 804 through expansion valve 810 and the cycle begins again.

As with at least some other examples in accordance with this disclosure, conditioning system 800 can be operated in multiple modes depending upon various factors, including the heat load from the enclosed space and/or the outdoor air (or incoming scavenger air) conditions. For example, system controller 150 can be configured to control elements of system 800 (and other example systems in accordance with this disclosure) to operate differently in different modes. System controller 150 can be configured to operate system 800 in an economizer mode and evaporation mode, as well as other modes. In the economizer mode, generally, there is sufficient cooling capacity in the outdoor air entering the system that LAHX2 112 (or pre-cooler 302 with a slightly modified fluid circuit) can cool the water or other fluid with the scavenger air without cooling by LAMEE 108 being required. In the evaporation mode, for example, pre-cooler 302, LAMEE 108 and LAHX2 112 may all be activated and used to cool the water flowing through the system using the scavenger air passing through scavenger plenum 104. Additionally, in an evaporation plus DX mode, DX unit 802 may be activated and used to provide supplemental cooling to the process air cooled by LAHX1 110.

In one example, system controller 150 is configured to cause conditioning system 800 to operate in the evaporation mode. In this mode, for example, outdoor scavenger air is drawn into and through scavenger plenum 104 by fan 136. The outdoor air passes through and is cooled by pre-cooler 302 using fluid delivered to the inlet of the pre-cooler by a fluid circuit from tank 202. The cooled outdoor air then flows through and evaporatively cools the fluid flowing through LAMEE 108. The scavenger air passes LAMEE 108 and flows through LAHX2 112. LAHX2 112 receives fluid from the outlet of LAHX1 110 and the scavenger air cools the heated fluid received from LAHX1 110. Fan 136 then exhausts the scavenger air out of outlet 118 of scavenger plenum 104.

The water or other evaporative cooling fluid cooled by LAMEE 108 is transported by the fluid circuit to tank 202, which stores the water. From tank 202, the water is transported to the inlet of pre-cooler 302 and to the inlet of LAHX1 110. LAHX1 110 cools the heated process air returned to process plenum 106 from the enclosed space using the water cooled by LAHX2 112.

Still in the evaporation mode, the water flows from the outlet of LAHX1 110 in process plenum 106 to the inlet of LAHX2 112 in scavenger plenum 104. System controller 150 can, in the evaporation mode, activate or not activate valve 140 (depending upon the default state of the valve) to cause the water from the outlet of LAHX2 112 to flow into tank 202.

In the evaporation plus DX mode, system controller 150 activates DX unit 802. In this mode, LAHX1 110 cools the process air using the cooled water or other fluid from tank 202. Additionally, the process air passes LAHX1 110 and is cooled further by DX coil 804 arranged in process plenum 106 downstream of LAHX1 110. In this case, DX coil 804 may cool the process air to the target supply temperature before the air is supplied to the enclosed space.

System controller 150 can also be configured to cause conditioning system 800 to operate in the economizer mode. For example, in the economizer mode, system controller 150 can cause pre-cooler 302, LAMEE 108 and likely DX unit 802 to be deactivated and/or cause the scavenger air to bypass the pre-cooler 302 and the LAMEE 108. In this mode, as described with reference to other examples in accordance with this disclosure, LAHX2 112 cools the water using the scavenger air and transports the water to LAHX1 110 via valve 140 and tank 202.

Figure 9:
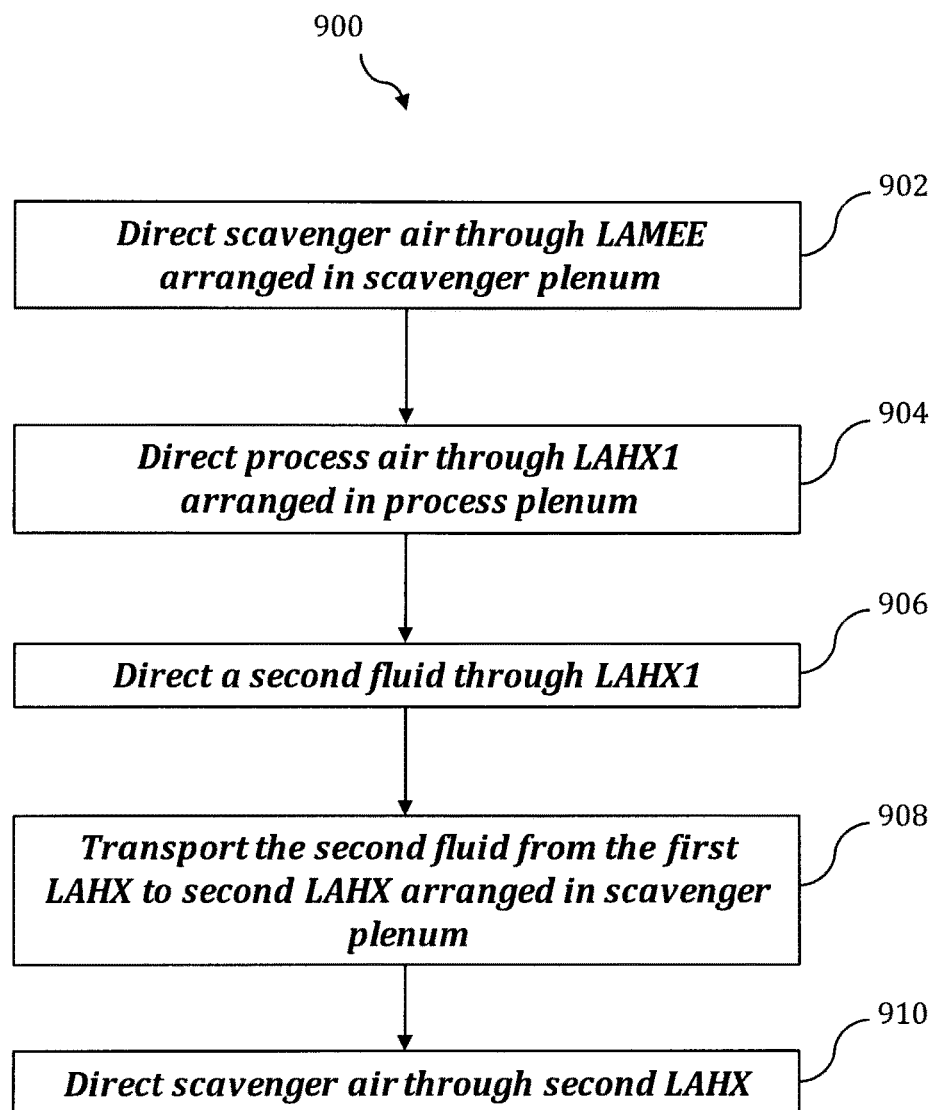
FIG. 9 is a flowchart depicting a method of operating a conditioning system in accordance with this disclosure.

FIG. 9 is a flowchart depicting an example method 900 of operating a conditioning system in accordance with this disclosure. In FIG. 9, method 900 includes directing scavenger air through a liquid to air membrane energy exchanger (LAMEE) arranged inside a scavenger plenum (902), directing process air through a first liquid-to-air heat exchanger (LAHX) arranged inside a process plenum (904), directing a second fluid through the first LAHX (906), transporting the second cooling fluid from the first LAHX to a second LAHX arranged inside the scavenger plenum downstream of the LAMEE (908), and directing the scavenger air through the second LAHX (910).

The LAMEE is configured to use the scavenger air to evaporatively cool a first fluid flowing through the LAMEE. The temperature of the first fluid at a LAMEE outlet is lower than a temperature of the first fluid at a LAMEE inlet. The process plenum is sealed from the scavenger plenum such that the process and scavenger air generally do not intermix. The first LAHX is configured to directly and sensibly cool heated process air from the enclosed space to a supply air temperature (or within acceptable tolerances thereof) using the second fluid flowing through the first LAHX. The second LAHX is configured to receive and cool the second cooling fluid heated by the first LAHX using the scavenger air. In some examples, method 800 can also include bypassing the LAMEE such that the scavenger air does not flow there through and causing the second fluid to recirculate between the first LAHX and the second LAHX.

Example method 900 of FIG. 9 illustrates generally the manner in which examples according to this disclosure function to condition the air in an enclosed space. The functions of the method of FIG. 9 can be carried out by a variety of conditioning systems in accordance with this disclosure. For example, the functions of method 800 can be carried out by conditioning system 100, 200, 300, 400, 500, 600, 700 and 800, the components and functions of which are described above with reference to FIGS. 1-8, respectively.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Examples, as described herein, may include, or may operate on, logic or a number of components, modules, or mechanisms. Modules may be hardware, software, or firmware communicatively coupled to one or more processors in order to carry out the operations described herein. Modules may hardware modules, and as such modules may be considered tangible entities capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine-readable medium. In an example, the software, when executed by the underlying hardware of the module, causes the hardware to perform the specified operations. Accordingly, the term hardware module is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software; the general-purpose hardware processor may be configured as respective different modules at different times. Software may accordingly configure a hardware processor, for example, to constitute a particular module at one instance of time and to constitute a different module at a different instance of time. Modules may also be software or firmware modules, which operate to perform the methodologies described herein.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

NOTES & EXAMPLES

The present application provides for the following exemplary embodiments or examples, the numbering of which is not to be construed as designating levels of importance:

Example 1 provides A system for controlling conditions in an enclosed space, the system comprising: a scavenger plenum configured to direct scavenger air from a scavenger inlet to a scavenger outlet; a process plenum sealed from the scavenger plenum and configured to direct process air from a process inlet to a process outlet, the process inlet receiving heated air from the space and the process outlet supplying cooled air to the space; a liquid-to-air membrane energy exchanger (LAMEE) arranged inside the scavenger plenum, the LAMEE configured to use the scavenger air to evaporatively cool a first fluid flowing through the LAMEE, a temperature of the first fluid at a LAMEE outlet being lower than a temperature of the first fluid at a LAMEE inlet; a first liquid-to-air heat exchanger (LAHX) arranged inside the process plenum, the first LAHX configured to directly and sensibly cool the heated air from the space to a supply air temperature using a second fluid flowing through the first LAHX; a second LAHX arranged inside the scavenger plenum downstream of the LAMEE, the second LAHX configured to receive and cool the second fluid heated by the first LAHX using the scavenger air; and a fluid circuit that transports the first and second fluids among the LAMEE, the first LAHX, and the second LAHX.

Example 2 provides the system of Example 1 and optionally wherein the first and second fluids comprise one fluid, the one fluid flowing through the LAMEE, the first LAHX and the second LAHX.

Example 3 provides the system of Example 1 and optionally also comprising further comprising a system controller configured to operate the conditioning system in an evaporation mode, in which the one fluid continuously or periodically recirculates between the first LAHX and the second LAHX without passing through the LAMEE, the second fluid received by the first LAHX from the second LAHX and configured to cool the process air to the supply temperature.

Example 4 provides the system of examples 1 and 2 and optionally wherein the fluid circuit comprises: a first branch configured to transport the one fluid from the LAMEE outlet to an inlet of the first LAHX; a second branch configured to transport the one fluid from an outlet of the first LAHX to an inlet of the second LAHX; a third branch including a valve, the third branch configured to selectively transport the one fluid via the fluid circuit from the outlet of the second LAHX either to the inlet of the LAMEE or to the inlet of the first LAHX via the valve.

Example 5 provides the system of any of examples 1-4 and optionally including a system controller configured to operate the conditioning system in an evaporation mode, in which the system controller activates or deactivates the valve to cause the one fluid to be transported via the fluid circuit from the outlet of the second LAHX to the inlet of the first LAHX, the one fluid received by the first LAHX from the second LAHX and configured to cool the process air to the supply temperature.

Example 6 provides the system of any of examples 1-5 and optionally further comprising a pre-cooler arranged inside the scavenger plenum upstream of the LAMEE, the pre-cooler configured to condition the scavenger air prior to the scavenger air entering the LAMEE.

Example 7 provides the system of any of examples 1-6 and optionally wherein the pre-cooler is configured to receive the one fluid cooled by the LAMEE to condition the scavenger air.

Example 8 provides the system of any of examples 1-7 and optionally further comprising a fluid storage tank to store the one fluid received from at least one of the LAMEE outlet and an outlet of the second LAHX.

Example 9 provides the system of any of examples 1-8 and optionally further comprising further comprising a mechanical cooling system to cool the one fluid in the storage tank.

Example 10 provides the system of any of examples 1-9 and optionally further comprising wherein the first and second fluids are different fluids.

Example 11 provides the system of any of examples 1-10 and optionally wherein the fluid circuit comprises a liquid-to-liquid heat exchanger (LLHX) configured to cool the second fluid using the first fluid.

Example 12 provides the system of any of examples 1-11 and optionally further comprising a pre-cooler arranged inside the scavenger plenum upstream of the LAMEE, the pre-cooler configured to condition the scavenger air prior to the scavenger air entering the LAMEE.

Example 13 provides the system of any of examples 1-12 and optionally further comprising a fluid storage tank to store the first fluid received from and cooled by the LAMEE.

Example 14 provides the system of any of examples 1-13 and optionally further comprising a mechanical cooling system to cool the first fluid in the storage tank.

Example 15 provides the system of any of examples 1-14 and optionally wherein the fluid circuit comprises: a first fluid circuit configured to transport the first fluid from the LAMEE outlet, through the LLHX and return the first fluid to the LAMEE inlet; a second fluid circuit fluidically isolated from the first fluid circuit, the second fluid circuit configured to transport the one fluid from an outlet of the second LAHX through the LLHX to an inlet of the first LAHX, and return the first fluid from an outlet of the first LAHX to an inlet of the second LAHX.

Example 16 provides the system of any of examples 1-15 and optionally further comprising a system controller configured to cause the conditioning system to operate in an economizer mode, in which the system controller deactivates the LLHX and causes the second fluid to be recirculated between the first LAHX and the second LAHX, the second fluid received by the first LAHX from the second LAHX cooling the process air to the supply temperature.

Example 17 provides the system of any of examples 1-16 and optionally further comprising a pre-cooler arranged inside the scavenger plenum upstream of the LAMEE, the pre-cooler configured to condition the scavenger air prior to the scavenger air entering the LAMEE.

Example 18 provides the system of any of examples 1-17 and optionally further comprising a storage tank to store at least one of the first fluid and the second fluid.

Example 19 provides the system of any of examples 1-18 and optionally further comprising a mechanical cooling system to cool at least one of the first fluid and the second fluid.

Example 20 provides a method of operating a conditioning system configured to condition the air in an enclosed space, the method comprising: directing scavenger air through a liquid-to-air membrane energy exchanger (LAMEE) arranged inside a scavenger plenum, the LAMEE using the scavenger air to evaporatively cool a first fluid flowing through the LAMEE, a temperature of the first fluid at a LAMEE outlet being lower than a temperature of the first fluid at a LAMEE inlet; directing process air through a first liquid-to-air heat exchanger (LAHX) arranged inside a process plenum, the process plenum being sealed from the scavenger plenum; directing a second fluid through the first LAHX, the first LAHX configured to directly and sensibly cool heated process air from the space to a supply air temperature using the second fluid flowing through the first LAHX; transporting the second fluid from the first LAHX to a second LAHX arranged inside the scavenger plenum downstream of the LAMEE; and directing the scavenger air through the second LAHX, the second LAHX configured to receive and cool the second fluid heated by the first LAHX using the scavenger air.

Example 21 provides the system of example 20 and optionally further comprising bypassing the LAMEE such that the scavenger air does not flow there through and causing the second fluid to recirculate between the first LAHX and the second LAHX.

Various aspects of the disclosure have been described. These and other aspects are within the scope of the following claims.

What is claimed is:

1. A system for controlling conditions in an enclosed space, the system comprising:
a scavenger plenum configured to direct scavenger air from a scavenger inlet to a scavenger outlet;
a process plenum sealed from the scavenger plenum and configured to direct process air from a process inlet to a process outlet, the process inlet receiving heated air from the space and the process outlet supplying cooled air to the space;
a liquid-to-air membrane energy exchanger (LAMEE) arranged inside the scavenger plenum, the LAMEE configured to use the scavenger air to evaporatively cool a first fluid flowing through the LAMEE, a temperature of the first fluid at a LAMEE outlet being lower than a temperature of the first fluid at a LAMEE inlet;
a first liquid-to-air heat exchanger (LAHX) arranged inside the process plenum, the first LAHX configured to directly and sensibly cool the heated air from the space to a supply air temperature using a second fluid flowing through the first LAHX;
a second LAHX arranged inside the scavenger plenum downstream of the LAMEE, the second LAHX configured to receive and cool the second fluid heated by the first LAHX using the scavenger air; and
a fluid circuit that transports the first and second fluids among the LAMEE, the first LAHX, and the second LAHX.

2. The system of claim 1, wherein the first and second fluids comprise one fluid, the one fluid flowing through the LAMEE, the first LAHX and the second LAHX.

3. The system of claim 1, further comprising a system controller configured to operate the conditioning system in an evaporation mode, in which the one fluid continuously or periodically recirculates between the first LAHX and the second LAHX without passing through the LAMEE, the second fluid received by the first LAHX from the second LAHX and configured to cool the process air to the supply temperature.

4. The system of claim 2, wherein the fluid circuit comprises:
a first branch configured to transport the one fluid from the LAMEE outlet to an inlet of the first LAHX;
a second branch configured to transport the one fluid from an outlet of the first LAHX to an inlet of the second LAHX;
a third branch including a valve, the third branch configured to selectively transport the one fluid via the fluid circuit from the outlet of the second LAHX either to the inlet of the LAMEE or to the inlet of the first LAHX via the valve.

5. The system of claim 4, further comprising a system controller configured to operate the conditioning system in an evaporation mode, in which the system controller activates or deactivates the valve to cause the one fluid to be transported via the fluid circuit from the outlet of the second LAHX to the inlet of the first LAHX, the one fluid received by the first LAHX from the second LAHX and configured to cool the process air to the supply temperature.

6. The system of claim 2, further comprising a pre-cooler arranged inside the scavenger plenum upstream of the LAMEE, the pre-cooler configured to condition the scavenger air prior to the scavenger air entering the LAMEE.

7. The system of claim 6, wherein the pre-cooler is configured to receive the one fluid cooled by the LAMEE to condition the scavenger air.

8. The system of claim 2, further comprising a fluid storage tank to store the one fluid received from at least one of the LAMEE outlet and an outlet of the second LAHX.

9. The system of claim 8, further comprising a mechanical cooling system to cool the one fluid in the storage tank.

10. The system of claim 1, wherein the first and second fluids are different fluids.

11. The system of claim 10, wherein the fluid circuit comprises a Liquid-to-liquid heat exchanger (LLHX) configured to cool the second fluid using the first fluid.

12. The system of claim 11, further comprising a pre-cooler arranged inside the scavenger plenum upstream of the LAMEE, the pre-cooler configured to condition the scavenger air prior to the scavenger air entering the LAMEE.

13. The system of claim 11, further comprising a fluid storage tank to store the first fluid received from and cooled by the LAMEE.

14. The system of claim 13, further comprising a mechanical cooling system to cool the first fluid in the storage tank.

15. The system of claim 11, wherein the fluid circuit comprises:
    a first fluid circuit configured to transport the first fluid from the LAMEE outlet, through the LLHX and return the first fluid to the LAMEE inlet;
    a second fluid circuit fluidically isolated from the first fluid circuit, the second fluid circuit configured to transport the one fluid from an outlet of the second LAHX through the LLHX to an inlet of the first LAHX, and return the first fluid from an outlet of the first LAHX to an inlet of the second LAHX.

16. The system of claim 11, further comprising a system controller configured to cause the conditioning system to operate in an economizer mode, in which the system controller deactivates the LLHX and causes the second fluid to be recirculated between the first LAHX and the second LAHX, the second fluid received by the first LAHX from the second LAHX cooling the process air to the supply temperature.

17. The system of claim 1, further comprising a pre-cooler arranged inside the scavenger plenum upstream of the LAMEE, the pre-cooler configured to condition the scavenger air prior to the scavenger air entering the LAMEE.

18. The system of claim 1 further comprising a storage tank to store at least one of the first fluid and the second fluid.

19. The system of claim 1, further comprising a mechanical cooling system to cool at least one of the first fluid and the second fluid.

20. A method of operating a conditioning system configured to condition the air in an enclosed space, the method comprising:
    directing scavenger air through a liquid-to-air membrane energy exchanger (LAMEE) arranged inside a scavenger plenum, the LAMEE using the scavenger air to evaporatively cool a first fluid flowing through the LAMEE, a temperature of the first fluid at a LAMEE outlet being lower than a temperature of the first fluid at a LAMEE inlet;
    directing process air through a first liquid-to-air heat exchanger (LAHX) arranged inside a process plenum, the process plenum being sealed from the scavenger plenum;
    directing a second fluid through the first LAHX, the first LAHX configured to directly and sensibly cool heated process air from the space to a supply air temperature using the second fluid flowing through the first LAHX;
    transporting the second fluid from the first LAHX to a second LAHX arranged inside the scavenger plenum downstream of the LAMEE; and
    directing the scavenger air through the second LAHX, the second LAHX configured to receive and cool the second fluid heated by the first LAHX using the scavenger air.

21. The method of claim 20, further comprising:
    bypassing the LAMEE such that the scavenger air does not flow there through; and
    causing the second fluid to recirculate between the first LAHX and the second LAHX.

22. The method of claim 20, wherein the first and second fluids comprise one fluid, the one fluid flowing through the LAMEE, the first LAHX and the second LAHX.

23. A system for controlling conditions in an enclosed space, the system comprising:
    a scavenger plenum configured to direct scavenger air from a scavenger inlet to a scavenger outlet;
    a process plenum sealed from the scavenger plenum and configured to direct process air from a process inlet to a process outlet, the process inlet receiving heated air from the space and the process outlet supplying cooled air to the space;
    a liquid-to-air membrane energy exchanger (LAMEE) arranged inside the scavenger plenum, the LAMEE configured to use the scavenger air to evaporatively cool a first fluid flowing through the LAMEE, a temperature of the first fluid at a LAMEE outlet being lower than a temperature of the first fluid at a LAMEE inlet;
    a first liquid-to-air heat exchanger (LAHX) arranged inside the process plenum, the first LAHX configured to directly and sensibly cool the heated air from the space to a supply air temperature using the first fluid flowing through the first LAHX; and
    a second LAHX arranged inside the scavenger plenum downstream of the LAMEE, the second LAHX configured to receive and cool the first fluid heated by the first LAHX using the scavenger air.

* * * * *

UNITED STATES PATENT AND TRADEMARK OFFICE
CERTIFICATE OF CORRECTION

PATENT NO. : 10,782,045 B2
APPLICATION NO. : 15/574205
DATED : September 22, 2020
INVENTOR(S) : LePoudre et al.

It is certified that error appears in the above-identified patent and that said Letters Patent is hereby corrected as shown below:

On the Title Page

Item [71], Column 1, Lines 2-4, delete "(CA); Philip Paul LePoudre, Saskatoon (CA); Manfred Gerber, Saskatoon (CA)" and insert --(CA)-- therefor Page 5, item [56], Column 2, Line 19, after "1/2009", insert --101368754 A 2/2009--

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*